(12) United States Patent
Lee et al.

(10) Patent No.: US 8,878,299 B2
(45) Date of Patent: Nov. 4, 2014

(54) BURIED CHANNEL TRANSISTOR AND METHOD OF FORMING THE SAME

(71) Applicant: Samsung Electronics Co. Ltd., Suwon-si (KR)

(72) Inventors: Ki-Seok Lee, Busan (KR); Dae-Ik Kim, Hwaseong-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/770,573

(22) Filed: Feb. 19, 2013

(65) Prior Publication Data

US 2013/0299834 A1    Nov. 14, 2013

(30) Foreign Application Priority Data

May 14, 2012    (KR) .................. 10-2012-0050828

(51) Int. Cl.
 *H01L 21/70* (2006.01)
 *H01L 29/78* (2006.01)
 *H01L 21/8234* (2006.01)

(52) U.S. Cl.
 CPC .......... *H01L 29/7827* (2013.01); *H01L 29/785* (2013.01); *H01L 21/823431* (2013.01)
 USPC ........................................... 257/368; 257/66

(58) Field of Classification Search
 CPC .............. H01L 29/7827; H01L 29/785; H01L 29/7887; H01L 27/115; H01L 27/11521; H01L 27/1157; H01L 27/11551; H01L 27/11578; H01L 27/11524; H01L 27/11556; H01L 29/6675; H01L 29/66545

USPC ................ 256/66, 316, 324, E29.3, E29.309; 257/66, 316, 324, E29.3, E29.309, 213, 257/347, 354, 349, 401, E21.409, E27.112, 257/E29.28

See application file for complete search history.

(56) References Cited

U.S. PATENT DOCUMENTS

| | | | |
|---|---|---|---|
| 2005/0285204 A1* | 12/2005 | Kim et al. ................ | 257/368 |
| 2008/0001197 A1 | 1/2008 | Kawakatsu et al. | |
| 2008/0079076 A1 | 4/2008 | Sheen et al. | |
| 2008/0121961 A1 | 5/2008 | Schloesser | |
| 2009/0065860 A1 | 3/2009 | Mikasa | |
| 2009/0108395 A1 | 4/2009 | Choi | |
| 2010/0078964 A1 | 4/2010 | Wylezinski et al. | |
| 2011/0049599 A1 | 3/2011 | Taketani | |

FOREIGN PATENT DOCUMENTS

| | | |
|---|---|---|
| KR | 2008-0001197 A | 1/2008 |
| KR | 10-2008-0029281 | 4/2008 |
| KR | 10-0843900 | 7/2008 |
| KR | 2010-0078964 A | 7/2010 |

* cited by examiner

*Primary Examiner* — Yu-Hsi D Sun
*Assistant Examiner* — Christina Sylvia
(74) *Attorney, Agent, or Firm* — Muir Patent Consulting, PLLC

(57) ABSTRACT

A semiconductor device may include a plurality of memory cells. The memory cells may be formed with respective fin shaped active regions with respective recesses formed therein. Thicknesses of the fins may be made relatively thicker around the recesses, such as by selective epitaxial growth around the recesses. The additional thicknesses may be asymmetrical so that portions of the fin on one side are larger than an opposite side. Related methods and systems are also disclosed.

21 Claims, 37 Drawing Sheets

BURIED CHANNEL TRANSISTOR AND METHOD OF FORMING THE SAME

CROSS-REFERENCE TO RELATED APPLICATIONS

This U.S. non-provisional patent application claims priority under 35 U.S.C. §119 to Korean Patent Application No. 10-2012-0050828, filed on May 14, 2012, in the Korean Intellectual Property Office, the entire contents of which are hereby incorporated by reference.

BACKGROUND

The present disclosure relates to semiconductor devices and methods of manufacturing the same and, more particularly, to buried channel transistor and methods of manufacturing the same.

In order to increase the channel length, transistors including recessed channels and gate structures buried in the recessed channels have been developed. As semiconductor devices become more and more integrated and design rules decrease, acquiring sufficient channel regions becomes difficult, even with the use of the recessed channels.

SUMMARY

According to some embodiments, a semiconductor memory device, may comprise a first memory cell formed with a first fin shaped active region, the first memory cell including a first transistor comprising a first channel, two first source/drains and a first gate disposed at the first channel; a second memory cell formed with a second fin shaped active region, the second memory cell including a second transistor comprising a second channel, two second source/drains and a second gate disposed at the second channel; a third memory cell formed with a third fin shaped active region, the third memory cell including a third transistor comprising a third channel, two third source/drains and a third gate disposed at the third channel; a gate line disposed over the first, second and third channels extending in a first direction, the first gate, the second gate and the third gate being portions of the gate line; wherein, each of the first, second and third fin shaped active regions extend in a second direction, and each are formed of a semiconductor material and comprise:
  a top surface, a first sidewall extending towards the top surface, a second sidewall opposite the first sidewall extending towards the top surface, a recess being formed in the top surface of the fin shaped active region extending through the fin shaped active region in the first direction, wherein the fin shaped active region has a larger thickness at a first location below the recess than a thickness of the fin shaped active region at a second location having the same height as the first location,
  wherein the second transistor is located between the first transistor and the third transistor, and wherein the first fin shaped active region and second fin shaped active region are spaced a first distance apart, and the second fin shaped active region and the third fin shaped active region are spaced a second distance apart, wherein the second distance is larger than the first distance.

A ratio of the second distance to the first distance may be within a range of 2 to 10.

A ratio of the second distance to the first distance may be within a range of 3 to 5.

The memory device may be a dynamic random access memory device.

Each of the first, second and third transistors may be connected to a respective capacitor at one of the two source/drains of the respective transistor.

The gate line may be a word line.

The semiconductor material of each of the first, second and third fin shaped active regions may be crystalline.

For each of the first, second and third fin shaped active regions, a portion of the fin shaped active region at a first distance below the recess of the fin may comprise polysilicon.

For each of the first, second and third fin shaped active regions, a vertical cross section of the fin taken at a location including the recess may be asymmetrical.

The second sidewall of the first fin shaped active region and the first sidewall of the second fin shaped active region may face each other and be substantially flat.

The first sidewall of the first fin shaped active region and the second sidewall of second fin shaped active region may face away from each other and each comprise a substantially flat major surface and a protrusion from the substantially flat major surface at a respective location under the respective recess.

Each protrusion of the first and second fin shaped active regions may protrude from a respective substantially flat major surface in the first direction and have a length in the second direction at a first height is equal to a width of the gate line in the second direction at the first height.

The substantially flat major surface of the first sidewall of the first fin shaped active region and the second sidewall of the second fin shaped active region may be formed of a crystalline semiconductor material and the protrusions from the substantially flat major surface of the first sidewall of the first fin shaped active region and the second sidewall of the second fin shaped active region are formed of polysilicon.

Each of the first, second and third fin shaped active regions may comprise a protrusion from at least one of the first and second sidewalls of the respective first, second or third fin shaped active region at the corresponding recess and comprises a crystalline semiconductor material.

The first gate may be disposed in the recess of the first fin shaped active region, the second gate may be disposed in the recess of the second fin shaped active region and the third gate may be disposed in the recess of the third fin shaped active region.

The first, second and third channels may be each formed at a surface of corresponding recess of the respective first, second and third fin shaped active regions.

The first channel may be formed at portions of the first and second sidewalls adjacent the recess of the first fin shaped active region, the second channel may be formed at portions of the first and second sidewalls adjacent the recess of the second fin shaped active region and the third channel may be formed at portions of the first and second sidewalls adjacent the recess of the third fin shaped active region.

For each of the first, second and third fin shaped active regions, at least one of the first and second sidewalls of the respective fin shaped active region may include a protrusion from a substantially flat major surface at a location at an upper surface of the respective fin shaped active region defining the respective recess. The first channel, second channel and third channel may be formed at the respective protrusions of the first, second and third fin shaped active regions.

The recesses of the fins of the first, second and third fin shaped active regions may be each defined by a U-shaped surface of the respective fin shaped active region. Each of the first, second and third channels may be formed at the respective U-shaped surface of the respective fin shaped active region.

Two first contacts may each respectively contact a respective one of the two first source/drains at a top surface of the fin shaped active region.

The first channel may be formed at a surface of the first fin shaped active region defining a lowermost portion of the recess of the first fin shaped active region.

A fourth transistor may be formed with the first fin shaped active region.

A dopant region of the first fin shaped active region may form one of the first source/drains of the first transistor and a source/drain of the fourth transistor.

Some embodiments contemplate systems comprising one or more of any of the disclosed memory devices.

Some embodiments contemplate methods for manufacturing one or more of any of the disclosed memory devices and/or systems.

BRIEF DESCRIPTION OF THE DRAWINGS

Example embodiments will be more clearly understood from the following brief description taken in conjunction with the accompanying drawings. FIGS. 1 through 55 represent non-limiting, example embodiments as described herein.

FIG. 55 is a schematic block diagram illustrating an example of computing systems including semiconductor device according to the exemplary embodiments.

DETAILED DESCRIPTION OF THE EMBODIMENTS

Figure 1A:
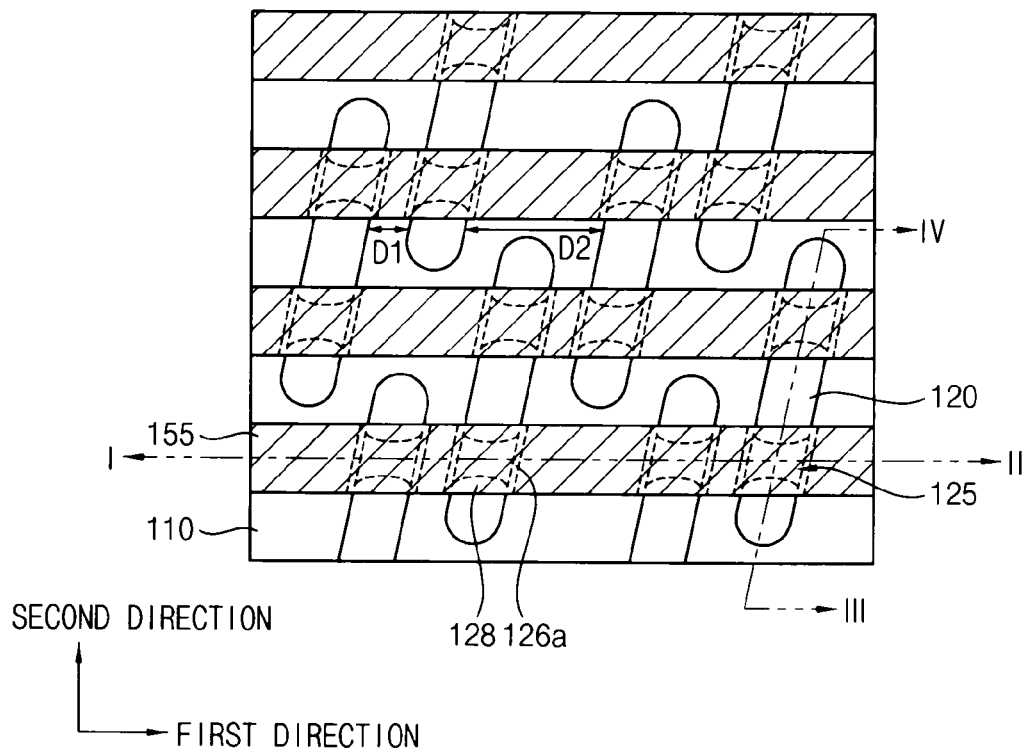
FIGS. 1A, 1B, and 1C are a plan view and cross-sectional views illustrating recessed channel transistor according to exemplary embodiments.

Various example embodiments will be described more fully hereinafter with reference to the accompanying drawings, in which some example embodiments are shown. The present invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises," "comprising," "includes," "including," "have," "having," etc., when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 1B:
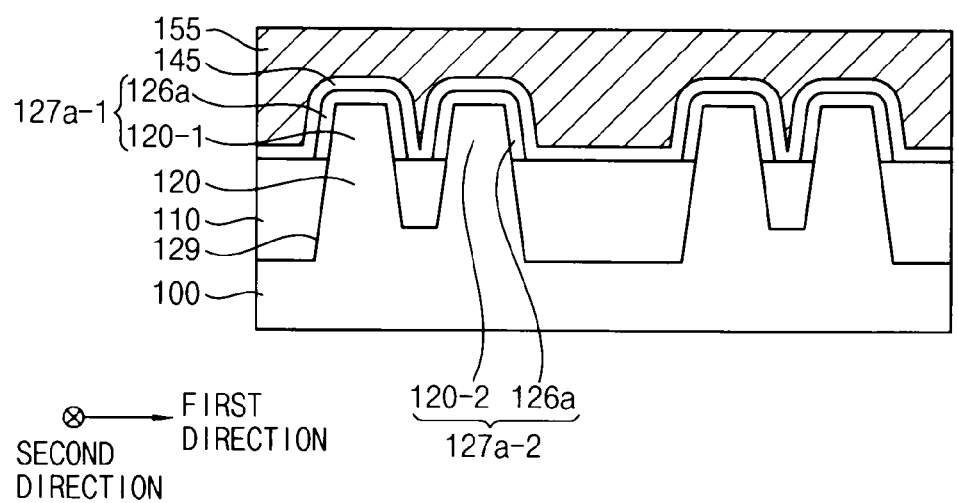
Figure 1C:
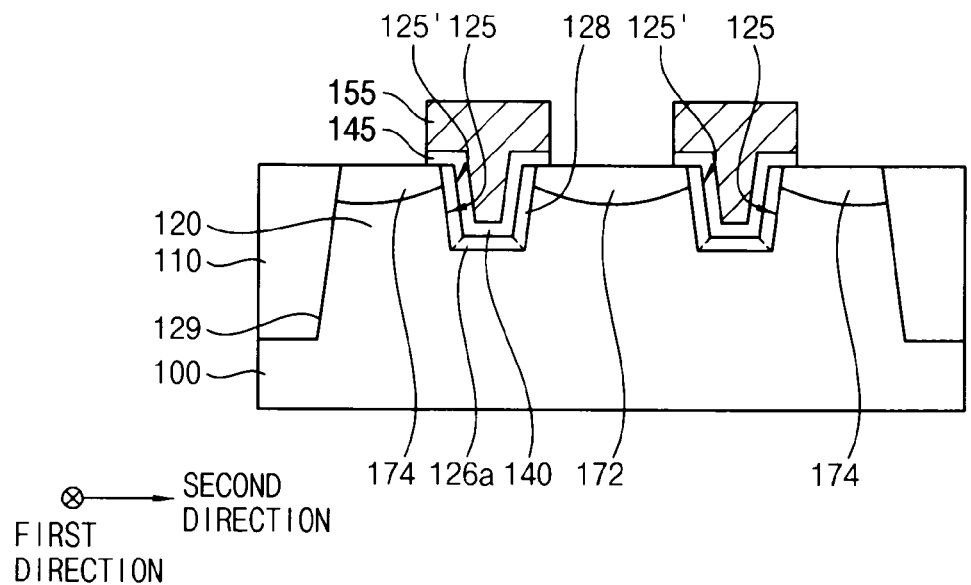

FIG. 1 is a plan view and FIGS. 1B and 1C are cross-sectional views illustrating recessed channel transistors according to exemplary embodiments. FIG. 1A is a plan view illustrating an array of recessed channel transistor according to the exemplary embodiments. FIG. 1B is a cross-sectional view taken along a line I-II of FIG. 1A. FIG. 1C is a cross-sectional view taken along a line III-IV of FIG. 1A.

Referring to FIGS. 1A, 1B, and 1C, a substrate 100 may include active regions 120 defined by a device isolation layer 110. The active regions 120 may be disposed regularly in a first direction and in a second direction substantially perpendicular to the first direction. The active regions may be formed as protrusions at the surface of the substrate. For example, the protrusions may be fin shaped, comprising an elongated protrusion raised with respect to surfaces of the substrate on either side of the fin. In this example, each of the fin shaped protrusions has an axis of symmetry running substantially in the second direction (e.g., in a direction about at or less than 5 degrees or at or less than 10 degrees from the second direction). For ease of description, the second direction is shown to be perpendicular to the first direction. However, the second direction need not be limited thereto and descriptions herein of elements and/or features with respect to the first and second directions likewise should not be considered limited to perpendicular first and second directions. The fin may be formed by etching the substrate on either side of the fin, or selectively epitaxially growing the fin from the surface of the substrate (e.g., within an opening of an insulator disposed over the substrate, the opening defining the lower boundaries of the fin). The substrate 100 may be a semiconductor substrate (e.g., a crystalline semiconductor substrate), such as a silicon substrate, a germanium substrate, a silicon-germanium substrate, a Silicon-On-Insulator (SOI) substrate, or a Germanium-On-Insulator (GOI) substrate. The device isolation layer 110 in this example is a shallow trench isolation (STI) formed by etching a trench in the substrate 100, filling the trench with a dielectric (e.g., silicon dioxide) and removing excess dielectric from the surface of the substrate 100 (e.g., with a chemical-mechanical planarization).

Gate insulating layer patterns 145 may be disposed on the substrate 100. The gate insulating layer patterns 145 may include silicon oxide, silicon nitride, silicon oxynitride, and/or metal oxide, for example. Gate electrodes 155 extending along the first direction may be disposed on the gate insulating layer pattern 145.

As shown in FIG. 1, a plurality of the gate electrodes may be disposed regularly in the second direction. Below each of the gate electrodes 155, neighboring two active regions 120 are spaced apart at a distance of "D1" and may form a pair of active regions. Pairs of the active regions may be spaced apart at the distance of "D2" under the same gate electrode. Referring to the exemplary embodiments, D2 may be greater than D1.

Recessed regions 125 may be defined as a trench or recess in the preliminary semiconductor fin 120-1 of the fin shaped active regions 120. The recessed regions 125 may be disposed below the gate electrodes 155. Referring to FIG. 1C, first impurity regions 172 and second impurity regions 174 may be formed within the active regions 120 adjacent to the recess regions 125.

Figure 1D:
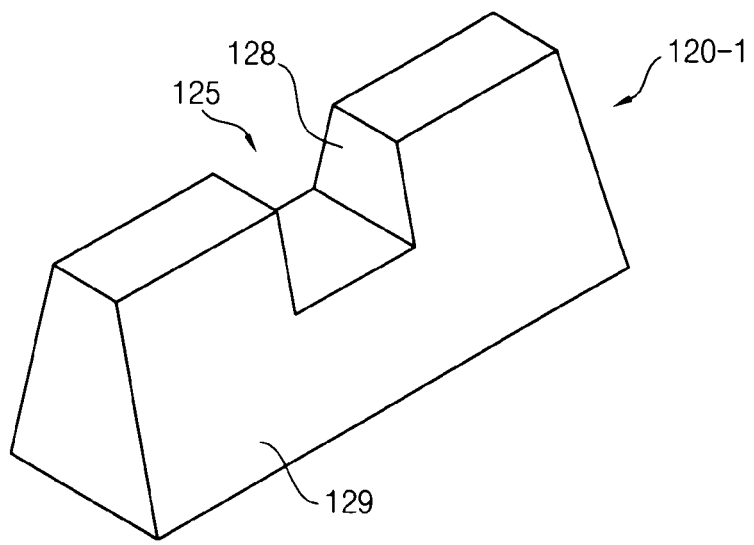
FIGS. 1D and 1E are perspective views of portions of recessed channel transistors according to some examples.
Figure 1E:
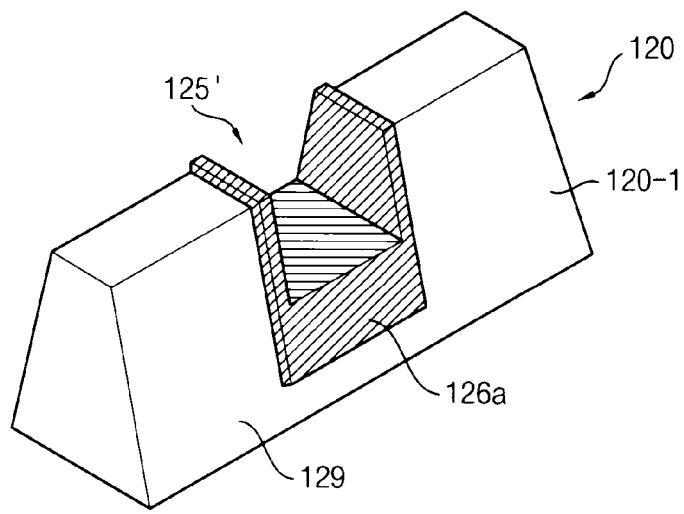

Referring to FIG. 1B, a plurality of preliminary semiconductor fins 120-1, 120-2 protrude above an upper surface of the device isolation layer 110 and may be disposed below the gate electrodes 155 and gate insulating patterns 145. Field-effect transistors (e.g., FinFETs) may be formed by the gate electrodes 155, the gate insulating patterns 145, the preliminary semiconductor fins 120-1, 120-2 (first and second impurity regions 172 and 174 formed in the acting as source/drain regions for the Fin FET—see FIG. 1C). Channel widths of the FinFETs may be made larger than the size of the preliminary semiconductor fin size would otherwise provide. For example, extended channels 126a covering the preliminary semiconductor fins 120-1, 120-2 may be formed at the portions of preliminary semiconductor fins 120-1, 120-2 defining the recess region 125 and may be at least partially disposed on the device isolation layer 110. The extended channels 126a may form protrusions from the major surfaces of the sidewalls 129 of the fin shaped active regions 120. As shown in FIG. 1A, the protruding portions of the extended channels 126a (right and left sides of extended channels 126a in FIG. 1A) may have a length in the second direction which may be the same as the width of the gate electrode 155 (e.g., measured at the same height). Referring to FIG. 1C, extended channels 126a may define corresponding modified recesses 125'. The channel of each FinFET may be formed about a corresponding modified recess 125'. The channel may extend down a sidewall of the modified recess 125', along the bottom of the modified recess 125' and up an opposite sidewall of the modified recess 125'. The channel may extend between the two impurity regions 172 and 174 (which may be two S/D regions for each FinFET transistor). The channel may be formed at opposite sidewalls 129 of the fin shaped active regions 120, as well as surfaces defining the modified recess 125' spanning between the opposite sidewalls 129 of the fin shaped active regions 120. Referring to the exemplary embodiment, lowered semiconductor fin portions 127a-1, 127a-2 include an extended channel 126a and the preliminary semiconductor fins 120-1, 120-2. The extended channel 126a is formed on the portions of the preliminary semiconductor fins 120-1 and 120-2 defining recess regions 125. For each of the fin shaped active regions 120, the extended channel 126a may be formed on opposite sidewalls of the preliminary semiconductor fin 120-1 (120-2), as well as surfaces of the preliminary semiconductor fin 120-1 (120-2) defining the recess region 125 spanning between the opposite sidewalls 129 of the preliminary semiconductor fin 120-1 (120-2). Sidewalls 129 of the preliminary semiconductor fin 120-1 may extend in the second direction and upwardly (which may be inclined with respect to the direction perpendicular to the substrate surface, as shown in FIG. 1B). Referring to FIG. 1C, the extended channels 126a may also be formed on recess side surfaces 128 of the preliminary semiconductor fin 120-1 defining the recess regions 125, and may act to define the modified recess 125'. The extended channels 126a may be polysilicon, for example. FIG. 1D is a perspective view of an exemplary preliminary semiconductor fin 120-1 showing the recessed region 125 within the preliminary semiconductor fin 120-1. FIG. 1E is a perspective view of an exemplary fin shaped active region 120 including the preliminary semiconductor fin 120-1 of FIG. 1D with the addition of an extended channel 126a. The extended channel is formed on opposite sidewalls 129 of the preliminary semiconductor fin 120-1, the recess side surfaces 128 and the surface connecting the opposite side walls 129 and recess side surfaces 128. The structure of the fin shaped active region 120 of FIG. 1E may be representative of that of the embodiment of FIGS. 1A-1C—to simplify the description, plural recessed regions 125 in a single fin shaped active region 120 are not shown in FIGS. 1D and 1E, but such features may be implemented as desired.

Figure 2A:
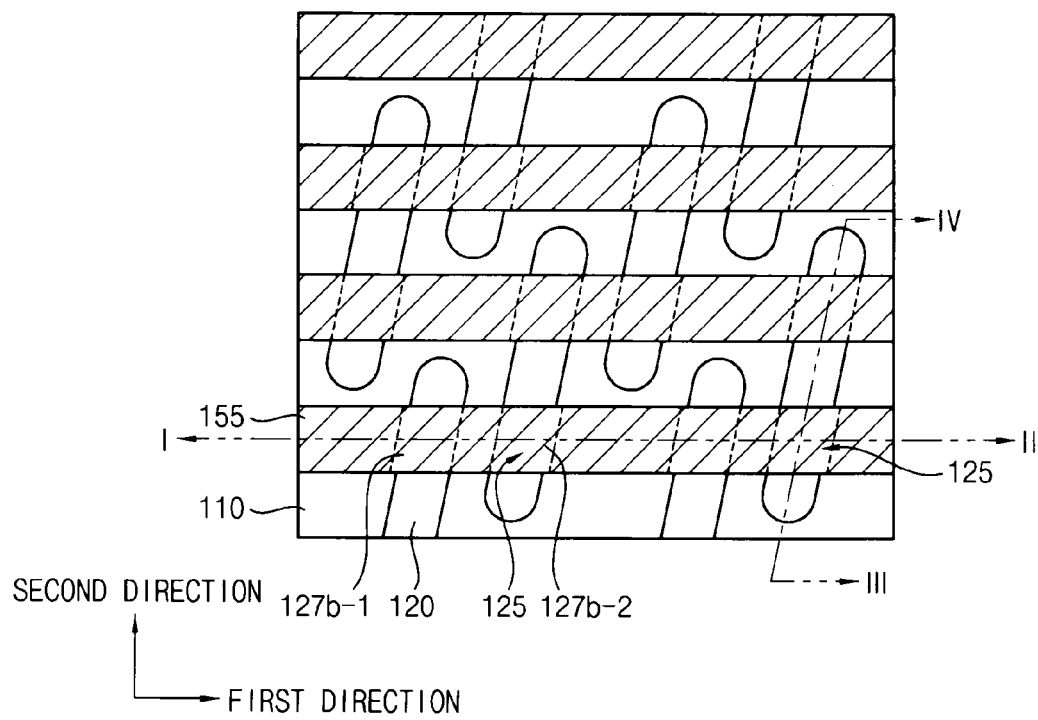
FIGS. 2A, 2B, and 2C are a plan view and cross-sectional views illustrating recessed channel transistors according to exemplary embodiments.
Figure 2B:
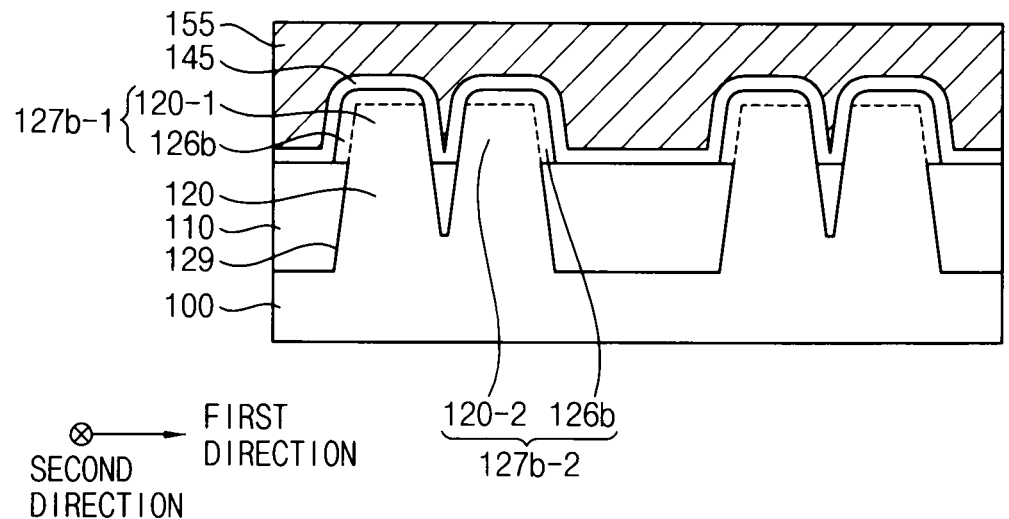
Figure 2C:
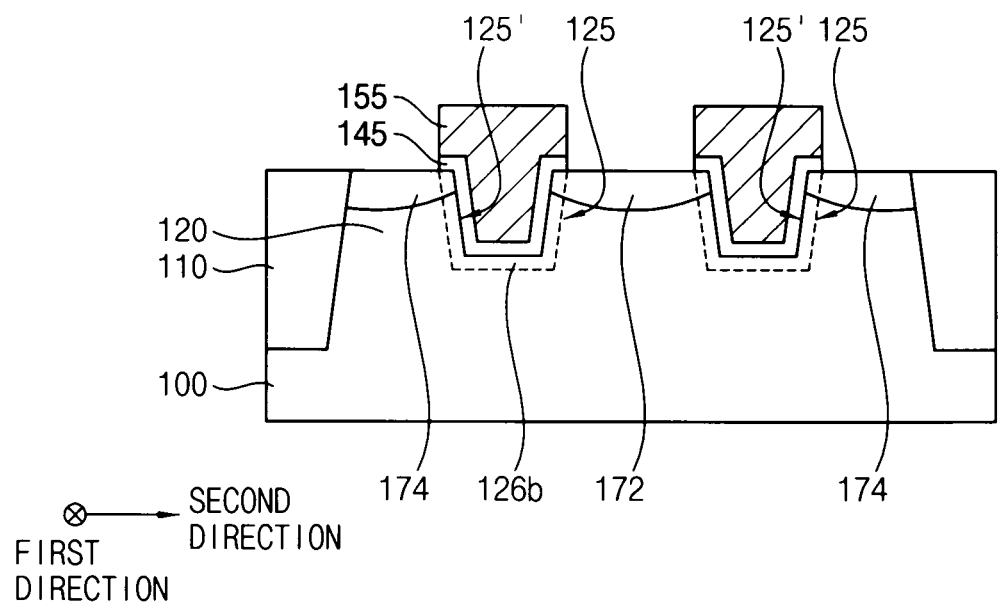

FIG. 2A is a plan view and FIGS. 2B and 2C are cross-sectional views illustrating recessed channel transistors according to exemplary embodiments. FIG. 2A is a plan view illustrating an array of recessed channel transistors according to exemplary embodiments. FIG. 2B is a cross-sectional view taken along a line I-II of FIG. 2A. FIG. 2C is a cross-sectional view taken along a line III-IV of FIG. 2A.

Referring to FIGS. 2A, 2B, and 2C, first lowered semiconductor fin portion 127b-1 and second lowered semiconductor fin portion 127b-2 adjacent to each other in the first direction may be formed in modified recesses 125' neighboring source drain regions 172 and 174.

Referring to exemplary embodiments, the first lowered semiconductor fin portion 127b-1 may include first preliminary semiconductor fin 120-1 and extended channel 126b and the second lowered semiconductor fin portion 127b-2 may include second preliminary semiconductor fin 120-2 and the extended channel 126b. Channels formed with the lowered semiconductor fin portions 127b-1, 127b-2 may have an extended width, extended in the first direction.

Referring to FIGS. 2A and 2B, neighboring first lowered semiconductor fin portion 127b-1 and the second lowered semiconductor fin portion 127b-2 may have a protrusion on just one of their sidewalls 129. Here the first lowered semiconductor fin portion 127b-1 and the second lowered semiconductor fin portion 127b-2 have protrusions on sidewalls 129 facing away or outwardly from the pair of lowered semiconductor fin portions 127b-1 and 127b-2 but not on the other sidewalls 129 (alternatively, these other sidewalls may have smaller protrusions than the outwardly facing sidewalls 129). Referring to FIG. 2A, neighboring fin shaped active regions 120 may respectively include lowered semiconductor fin portions 127b-1, 127b-2 with protrusions at recess regions 125, protruding from sidewalls 129 of the fin shaped active regions 120 in directions away from each other.

Figure 3A:
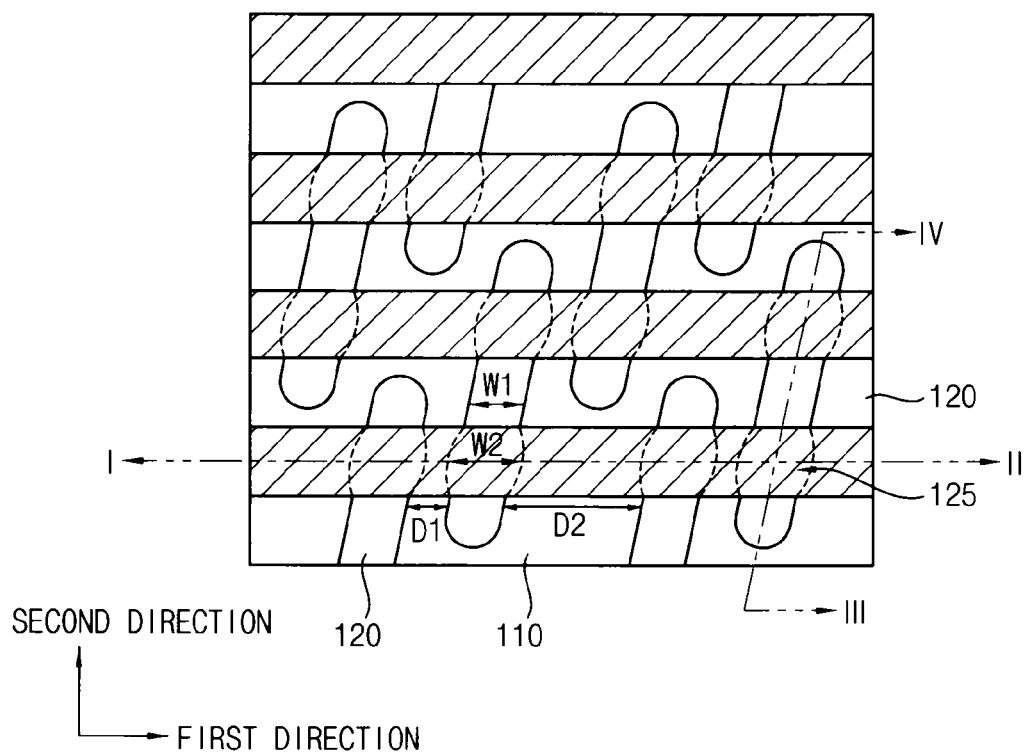
FIGS. 3A, 3B, and 3C are a plan view and cross-sectional views illustrating recessed channel transistors according to exemplary embodiments.
Figure 3B:
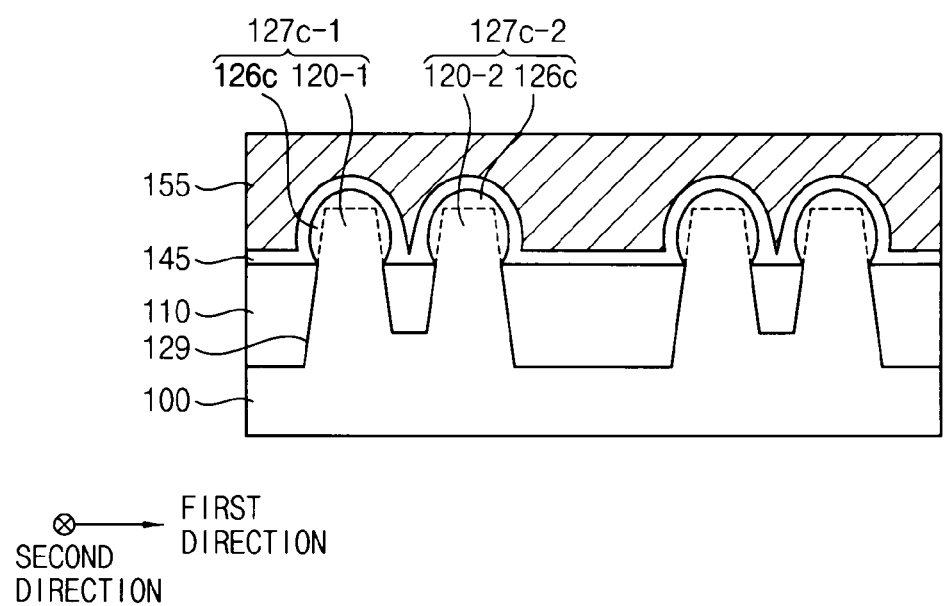
Figure 3C:
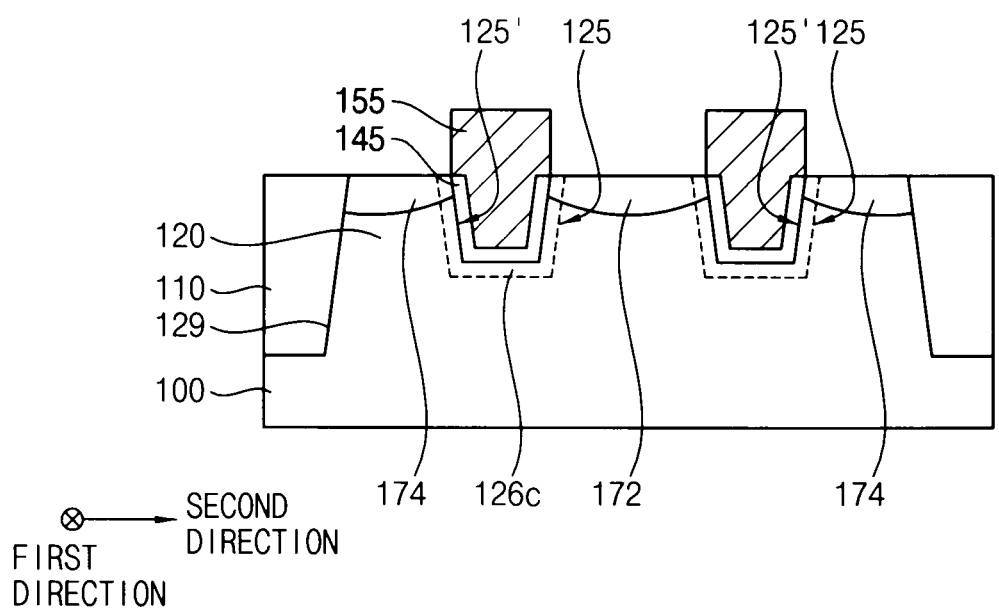

FIG. 3A is a plan view and FIGS. 3B and 3C are cross-sectional views illustrating recessed channel transistors according to exemplary embodiments. FIG. 3A is a plan view illustrating array of recessed channel transistors according to the exemplary embodiments. FIG. 3B is a cross-sectional view taken along a line I-II of FIG. 3A. FIG. 3C is a cross-sectional view taken along a line III-IV of FIG. 3A.

Referring to FIGS. 3A, 3B, and 3C, neighboring first lowered semiconductor fin portions 127c-1 and second lowered semiconductor fin portions 127c-2 protrude from a device isolation layer 110 and include modified recess regions 125'.

Referring to exemplary embodiments, first lowered semiconductor fin portion 127c-1 may include first preliminary semiconductor fin 120-1 and extended channel 126c and second lowered semiconductor fin portion 127c-2 may include second preliminary semiconductor fin 120-2 and extended channel 126c.

For example, the first lowered semiconductor fin portions 127c-1 and the second lowered semiconductor fin portions 127c-2 may have a substantially round type of surface profile. Referring to FIG. 3A, channels of transistors are formed at the recessed regions 125 and may have an extended width along the first direction as compared to a width of the remaining portions of the active regions 120 at the same or comparable height to the channels. The channels may have an extended width as compared to the preliminary semiconductor 120-1 (120-2) at the same or comparable height of the channels.

Figure 4A:
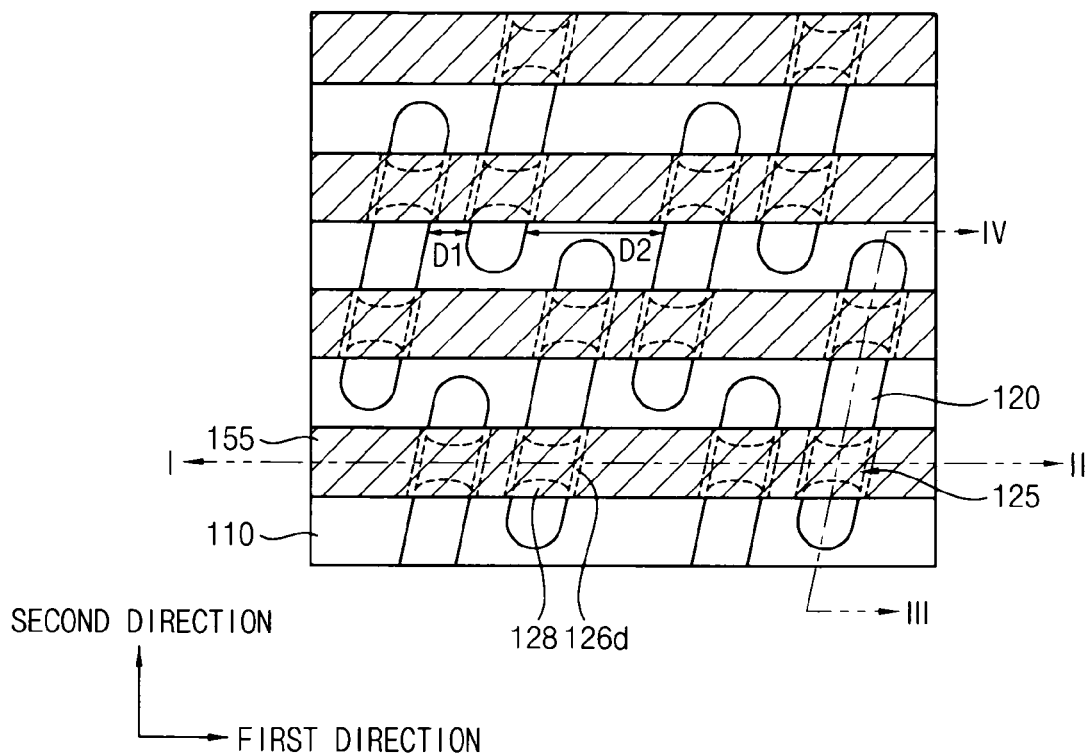
FIGS. 4A, 4B, and 4C are a plan view and cross-sectional views illustrating recessed channel transistors according to exemplary embodiments.
Figure 4B:
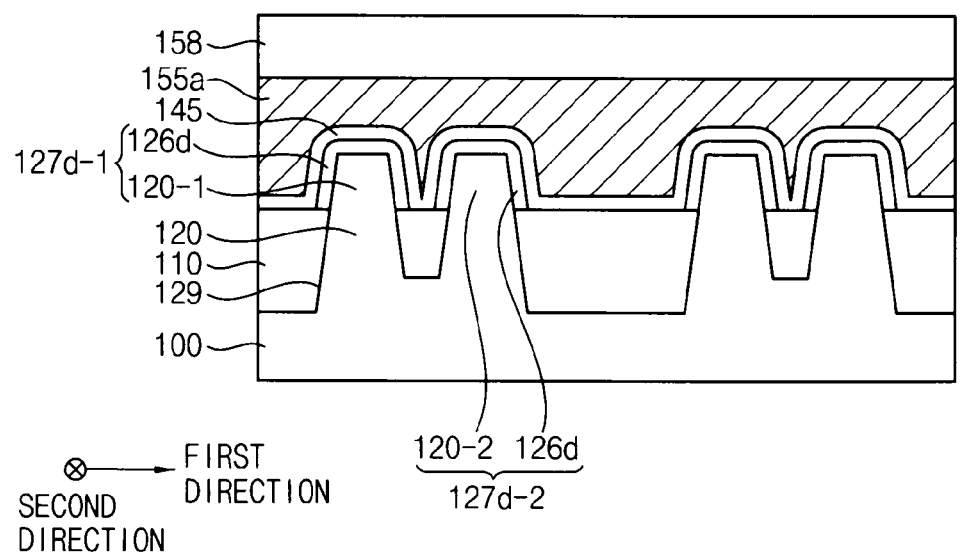
Figure 4C:
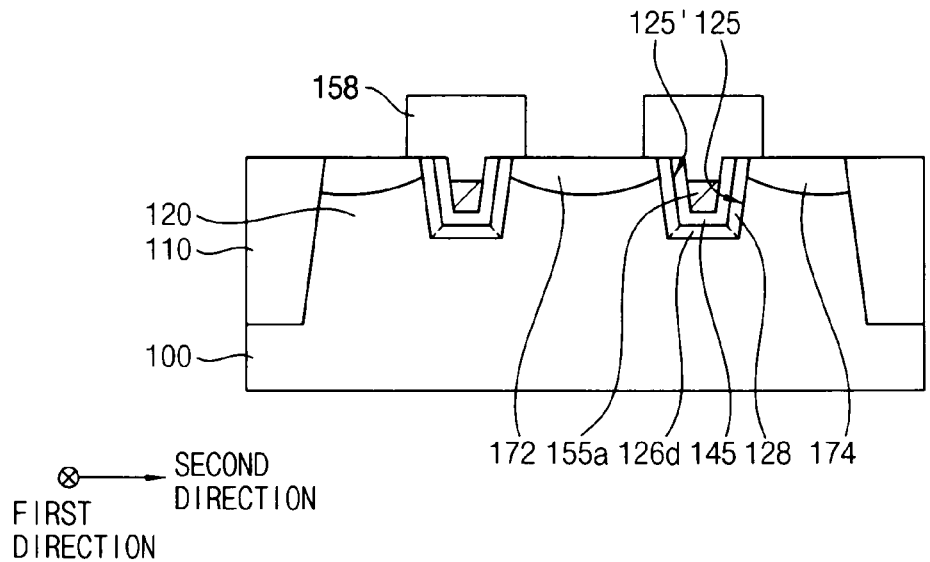

FIG. 4A is a plan view and FIGS. 4B and 4C are cross-sectional views illustrating recessed channel transistors according to exemplary embodiments. FIG. 4A is a plan view illustrating array of recessed channel transistor according to the exemplary embodiments. FIG. 4B is a cross-sectional view taken along a line I-II of FIG. 4A. FIG. 4C is a cross-sectional view taken along a line III-IV of FIG. 4A.

Referring to FIGS. 4A, 4B, and 4C, the recessed channel transistor may include a substrate 100, gate insulating patterns 145, gate electrodes 155, fin shaped active regions 120 with first impurity regions 172 and second impurity regions 174. The first impurity region 172 and the second impurity regions 174 may have roles as sources and drains of transistors.

The substrate 100 may be a silicon substrate, a germanium substrate, a silicon-germanium substrate, Silicon-On-Insulator (SOI) substrate, and Germanium-On-Insulator (GOI) substrate.

A device isolation layer 110 may be disposed in the substrate 100. Referring to the exemplary embodiments, a plurality of fin shaped active regions 120 may be disposed in an array, such as in both a first direction and in a second direction substantially perpendicular to the first direction.

Referring to the exemplary embodiments, transistors are formed in active regions 120 having channels and gates formed at corresponding recessed regions 125. Some pairs of neighboring transistors may be spaced apart at the distance of "D1" while other pairs of neighboring transistors may be spaced apart at the distance of "D2". Referring to the exemplary embodiments, D2 may have higher value than D1. In the example of FIG. 4A, 4B and 4C, along a gate electrode 155, pairs of transistors are spaced from each other with a distance of "D2" and within each pair, transistors forming the pair of transistors are spaced from each other at a distance of "D1".

A plurality of trenches each extend in the first direction and are disposed over the substrate 100. Recess regions 125 may be portions of the trenches where the trenches pass through the active regions 120.

Referring to FIG. 4B, a plurality of preliminary semiconductor fins 120-1, 120-2 protrude from upper surface of the device isolation layer 110 and may comprise elements of the fin shaped active regions 120. The preliminary semiconductor fins 120-1, 120-2 may extend along the second direction. For example, preliminary semiconductor fins 120-1, 120-2 may be formed of substantially same material as the substrate 100 and disposed as integral parts with the substrate 100. For example, the preliminary semiconductor fins 120-1, 120-2 may be formed as an integral part of the substrate by etching the substrate 100 or by epitaxially growing the preliminary semiconductor fins 120-1, 120-2 from the surface of the substrate 100.

Referring to the exemplary embodiments, extended channels 126d may be disposed on side surfaces 129 and an upper surface connecting the side surfaces 129 at the recessed region 125 of the protruding preliminary semiconductor fins 120-1, 120-2. The extended channels 126d may include substantially same materials as the preliminary semiconductor fins 120-1, 120-2. Referring to the exemplary embodiments, the extended channels 126d may include polysilicon. Alternatively, the extended channels 126d may be crystalline silicon (or other crystalline semiconductor material) that may be formed by epitaxial growth. Therefore, first lowered semiconductor fin portions 127d-1 may include the extended channels 126d and the first preliminary semiconductor fins 120-1 and second lowered semiconductor fin portions 127d-2 may include the extended channel 126d and the second preliminary semiconductor fins 120-2. The lowered semiconductor fin portions 127d-1, 127d-2 may have thicker width along the first direction as compared to that of the preliminary semiconductor fins 120-1, 120-2 (e.g., as the same corresponding height with respect to the upper surface of the semiconductor substrate 100).

Referring to FIGS. 4A, 4B, and 4C, recess side surfaces 128 defining recessed region 125 include extended channel 126d protruding in the second direction.

Referring to the exemplary embodiments, gate insulating patterns 145 may be disposed on the recess side surfaces 128 and on the extended channels 126d. The gate insulating patterns 145 may extend along the first direction within respective trenches and may be disposed to cover the surfaces of the modified recess 125' at the lowered semiconductor fin portions 127d-1, 127d-2.

Referring to the exemplary embodiments, the gate electrodes 155 (e.g., 155a) extend within corresponding trenches and are disposed within the recessed regions 125 associated with the corresponding trench, with gate insulating patterns 145 disposed therebetween. The gate electrodes 155/155a may each extend along the first direction. The gate electrodes may be regularly formed along the second direction. The gate electrodes 155a may be buried in lower portions of the recessed regions 125. Upper surfaces of the gate electrodes 155a may be lower than the upper surfaces of the surfaces fin shaped active region 120.

Capping layer patterns 158 may be formed in upper portions of the recessed regions 125 and may be disposed on the substrate 100, the extended channels 126d, the gate insulating patterns 145, and the gate electrodes 155a. The capping layer patterns 158 may be formed to contact corresponding ones of the gate electrodes 155a.

First impurity regions 172 and second impurity regions 174 may be disposed in upper portions of the fin shaped active regions 120 adjacent to the recessed regions 125. Referring to the exemplary embodiments, field-effect transistors (Fin-FET) may be formed by the gate electrodes 155a, the gate insulating patterns 145, the lowered semiconductor fin portions 127d-1, 127d-2, and the impurity regions 172, 174. Channel length and channel width may be increased within a small footprint, which may allow decreased channel resistance and high operating current.

Figure 5A:
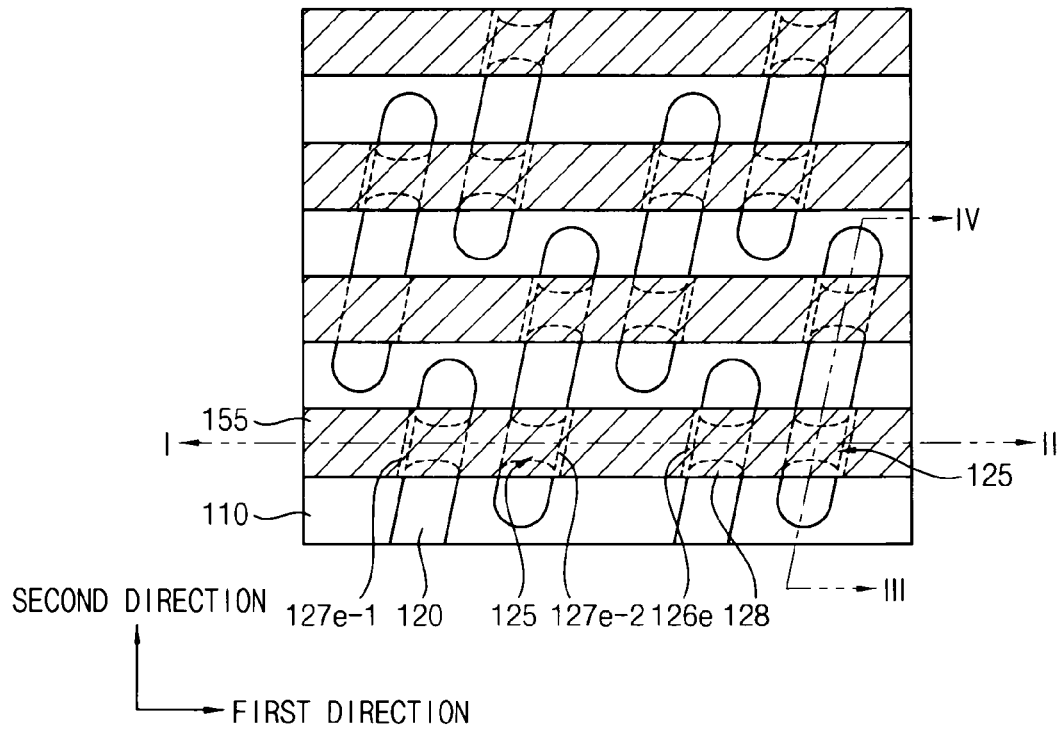
FIGS. 5A, 5B, and 5C are a plan view and cross-sectional views illustrating recessed channel transistors according to exemplary embodiments.
Figure 5B:
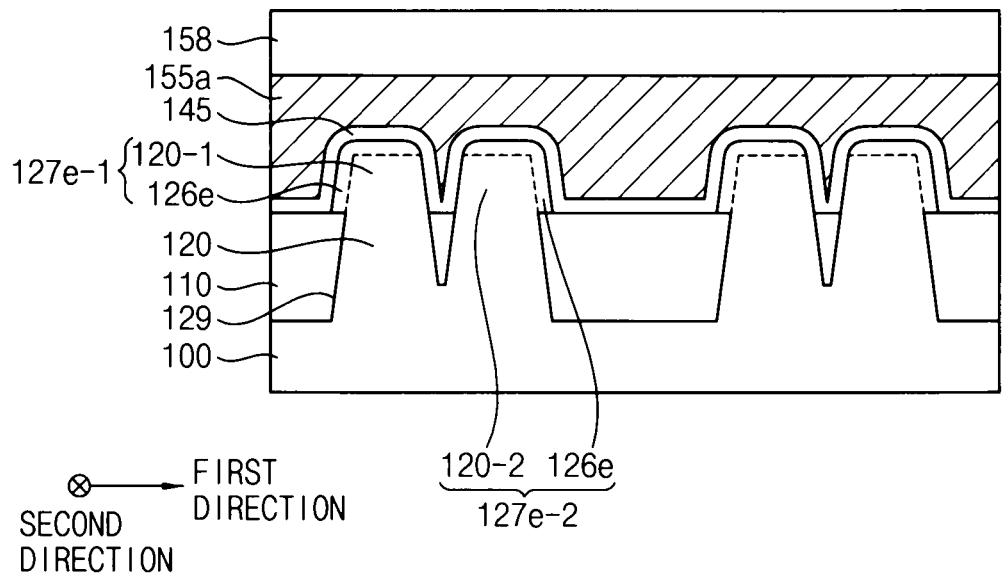
Figure 5C:
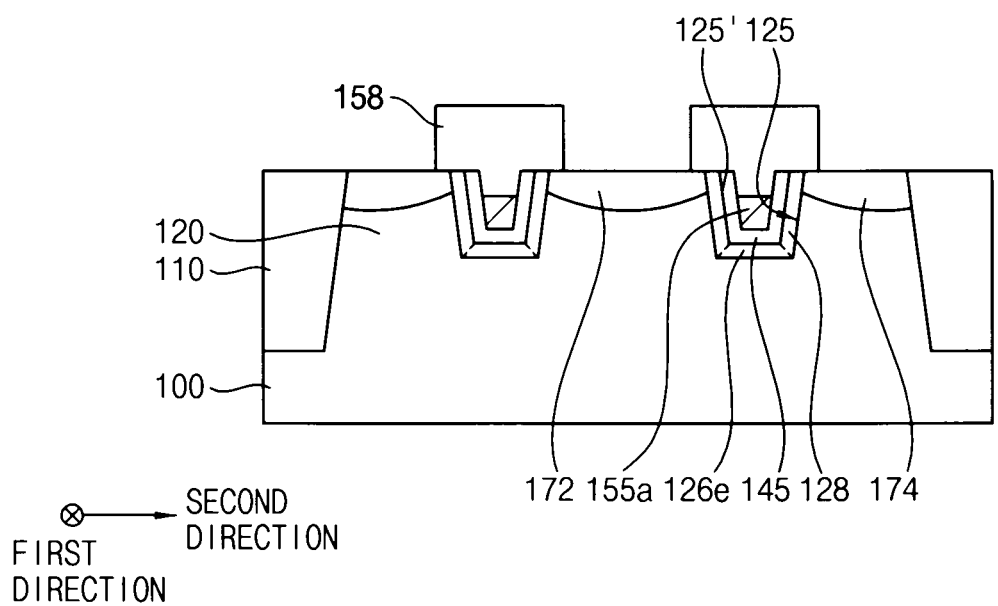

FIGS. 5A, 5B, and 5C are a plan view and cross-sectional views illustrating recess channel transistor according to exemplary embodiments. FIG. 5A is a plan view illustrating an array of recess channel transistor according to the exemplary embodiments. FIG. 5B is a cross-sectional view taken along a line I-II of FIG. 5A. FIG. 5C is a cross-sectional view taken along a line III-IV of FIG. 5A.

Referring to FIGS. 5A, 5B, and 5C, first lowered semiconductor fin portions 127e-1 including first preliminary semiconductor fins 120-1 and extended channels 126e and second lowered semiconductor fin portions 127e-2 including second preliminary semiconductor fins 120-2 and the extended channels 126e may be formed at respective recessed regions 125. Referring to the exemplary embodiments, the extended channels 126e may be disposed on the upper surface of the preliminary semiconductor fins 120-1, 120-2 at the recessed regions 125 and on the sidewalls 129 of the semiconductor fins 120-1, 120-2 that face outwardly with respect to closely spaced pairs of corresponding transistors. Referring to FIG. 5A and FIG. 5B, neighboring the first lowered semiconductor fin portions 127e-1 and the second lowered semiconductor fin portions 127e-2 may include protrusions (formed by respective extended channels 126e) from respective sidewalls 129 in directions opposite or away from each other.

Referring to FIG. 5A and FIG. 5C, recess sides 128 have extended channels 126e that protrude from respective recess sides 128 in the second direction.

Figure 17:
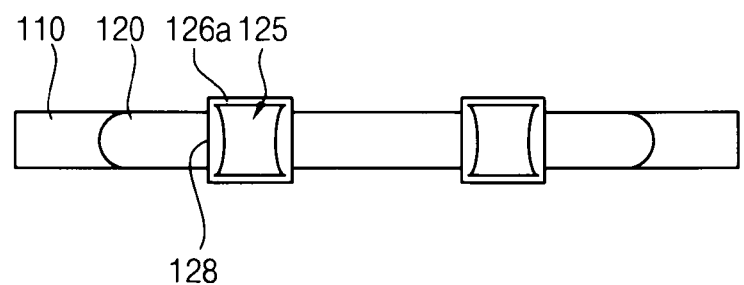

FIGS. 6 through 22 are plan views and cross-sectional views illustrating recessed channel transistors according to exemplary embodiments. FIGS. 6, 9, 12, and 14 are plan views illustrating a method of manufacturing recessed channel transistors according to exemplary embodiments. FIGS. 7, 10, 13, 15, 18, and 20 are cross-sectional views taken along a line I-II of the plan views. FIGS. 8, 11, 16, 19, 21, and 22 are cross-sectional views taken along a line III-IV of the plan views. FIG. 17 is a cross-sectional view taken along a line V-VI of FIG. 16.

Figure 6:
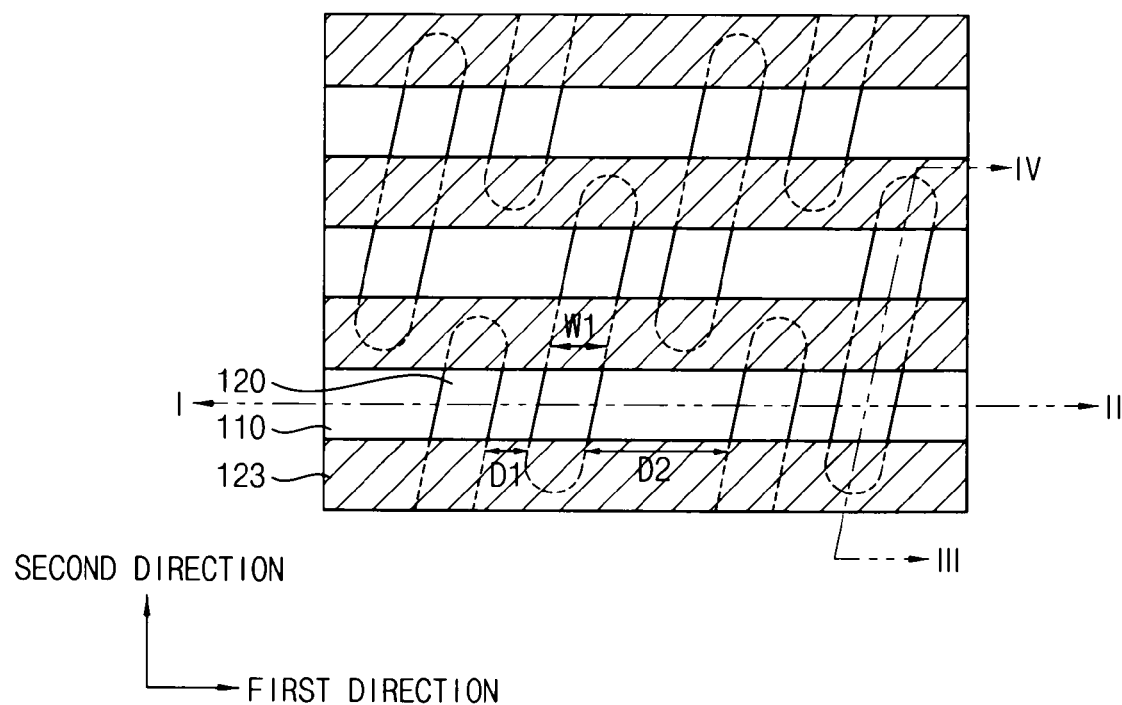
FIGS. 6 through 22 are plan views and cross-sectional views illustrating recessed channel transistors according to exemplary embodiments.
Figure 7:
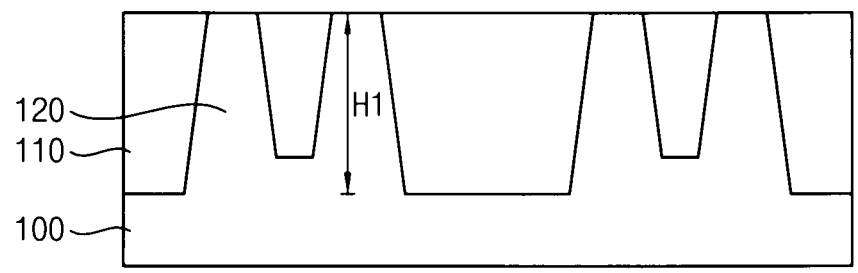
Figure 8:
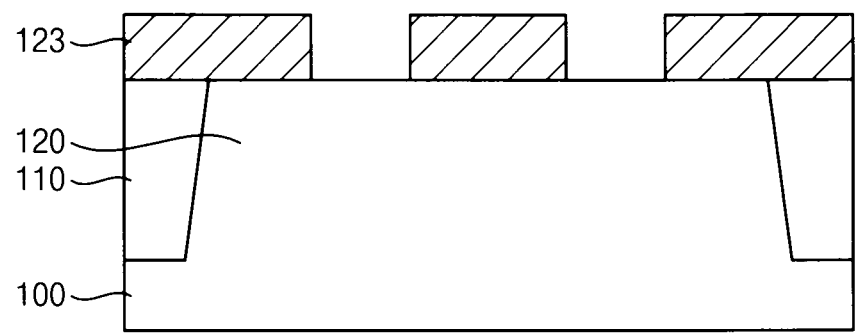

Referring to FIGS. 6, 7, and 8, device isolation layer 110 defining active regions 120 may be formed on a substrate 100. Mask patterns 123 may be formed on the substrate partially exposing the active regions 120 and the device isolation layer 110. The substrate 100 may be other crystalline semiconductor. The substrate 100 may be a silicon substrate, a germanium substrate, a silicon-germanium substrate, Silicon-On-Insulator (SOI) substrate, and Germanium-On-Insulator (GOI) substrate. The device isolation layer 110 in this example is a shallow trench isolation (STI) formed by etching a trench in the substrate 100, filling it with a dielectric (e.g., silicon dioxide) and removing excess dielectric from the surface of the substrate 100 (e.g., with a chemical-mechanical planarization).

Referring to exemplary embodiments, a plurality of the active regions 120 may be disposed regularly along a first direction and along a second direction substantially perpendicular to the first direction. Along a line extending in the first direction, an active region 120 may have a first neighboring active region 120 disposed a distance of "D1" away on one side and a second neighboring active region 120 disposed a distance of "D2" away on its other side. Referring to the exemplary embodiments, D2 may have higher value than D1. For example, D2 may be 2 to 10 times larger than D1. As another example, D2 may be 3 to 5 times larger than D1. Each the active regions 120 may have a first width W1 in the first direction. In this example, the distances D1 and D2 and the first width W1 may be measured at level of the top surfaces of the active regions 120. Alternatively, the distances D1 and D2 and the first width W1 may reflect dimensions at the bottom or middle levels of the active regions 120. Alternatively, the distances D1 and D2 and the first width W1 may be average dimensions of the active regions 120 and distances therebetween taken along a line extending in the first direction. Referring to FIG. 7, the active regions 120 may have a first height H1.

Mask patterns 123 may have a line shape extended along the first direction and a plurality of the mask patterns 123 may be formed regularly along the second direction. Referring to FIG. 8, locations of the upper surfaces of active regions 120 exposed by the mask patterns 123 are to be etched to form recess regions 125 (refer to FIG. 11) during a succeeding process.

According to exemplary embodiments, a mask layer may be formed on a device isolation layer 110 and active regions 120. The mask layer may comprise silicon nitride, for example. The mask layer may be formed using chemical vapor deposition (CVD), low pressure chemical vapor deposition (LPCVD), plasma enhanced chemical vapor deposition PECVD, and/or spin coating processes. The mask patterns 123 may be formed by removing partially the mask layer using photoresist patterns extending in the first direction as a mask (not shown).

Figure 9:
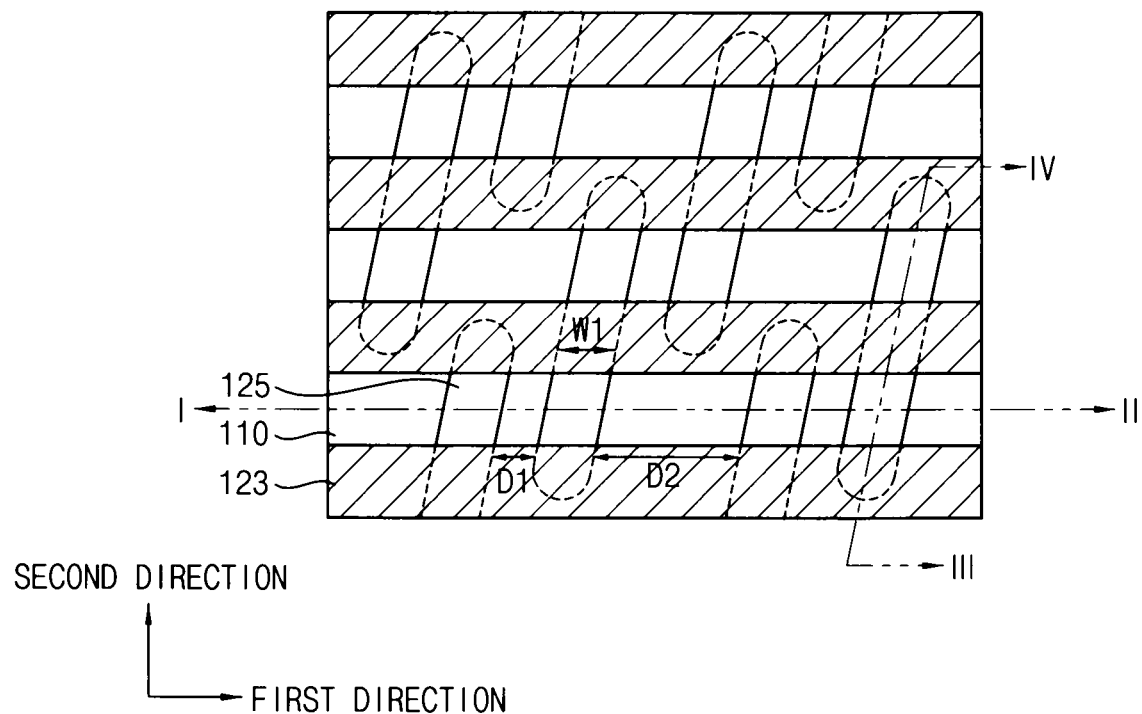
Figure 10:
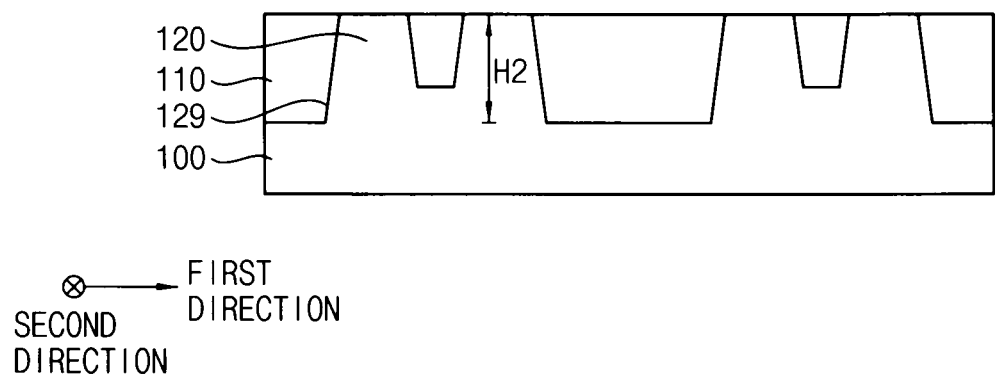
Figure 11:
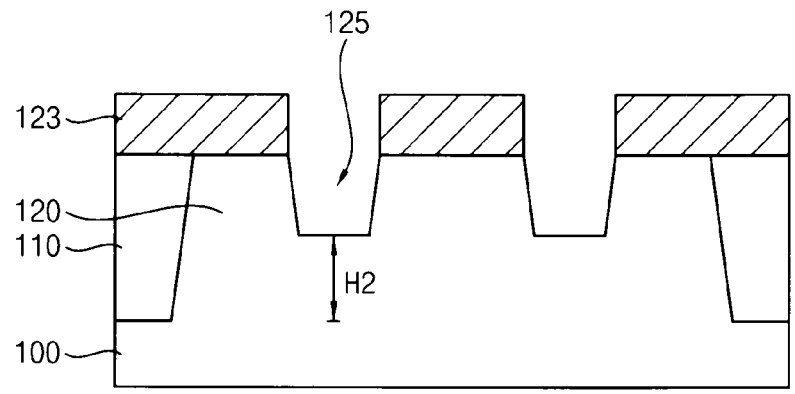

Referring to FIGS. 9, 10, and 11, the recessed regions 125 may be formed in the active regions 120 by partially etching the active regions 120 exposed by mask patterns 123. The recessed regions 125 may extend through the active regions 120 in the first direction. The recessed regions 125 may be part of one of several trenches (extending in the first direction) etched into the active regions 120 and the device isolation layers 110 using the mask patterns 123 as a mask.

Referring to the exemplary embodiments, two recessed regions may be formed in one active region 120. Referring to FIG. 10, portions of the active regions 120 at the bottom of the recessed regions 125 may have the second height H2 decreased from the first height H1. The recessed regions 125 may be formed by performing reactive ion etching (RIE) using chlorine gas.

Figure 12:
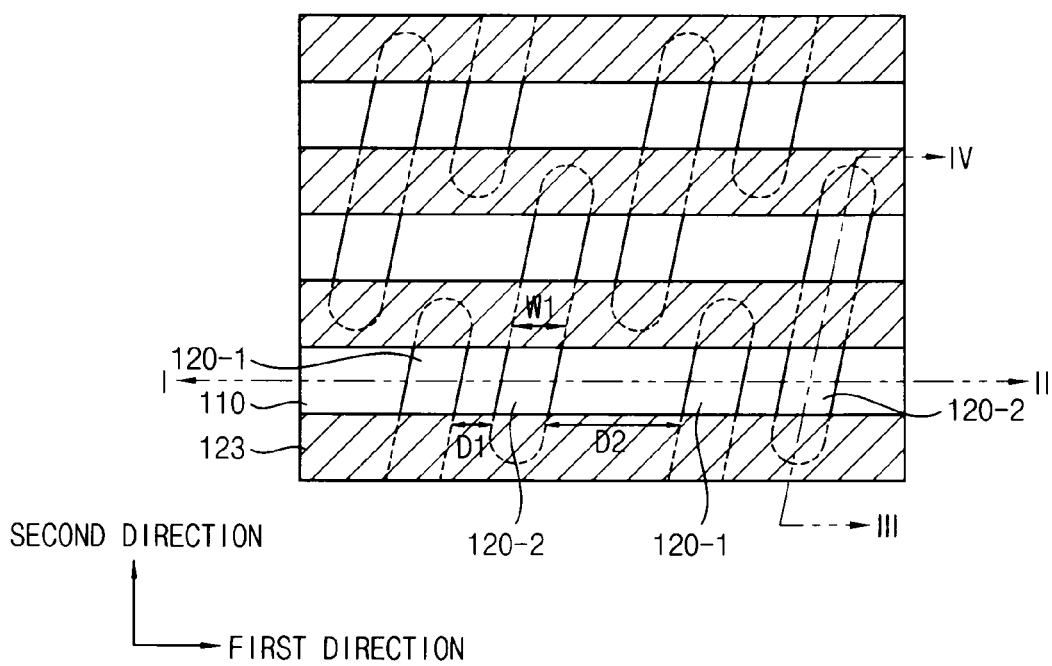
Figure 13:
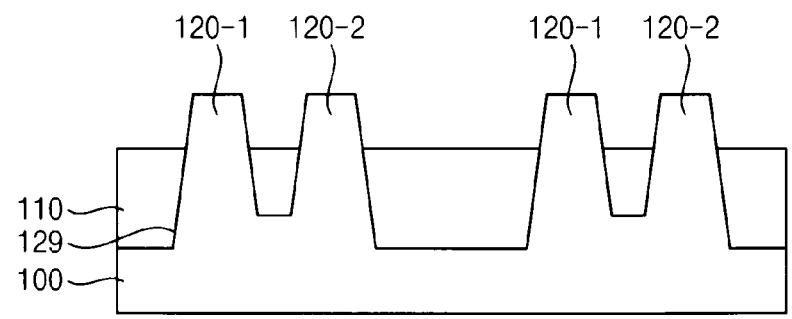

Referring to FIGS. 12 and 13, upper portions of the device isolation layer 110 exposed between neighboring the mask patterns 123 may be removed to partially expose sidewalls 129 of the active regions 120 (at locations adjacent the recessed regions 125). Therefore, preliminary semiconductor fins with portions protruding from the upper surface of the device isolation layer 110 may be formed. According to the exemplary embodiments, the preliminary semiconductor fins may include the first preliminary semiconductor fins 120-1 and the second preliminary semiconductor fins 120-2. Each of the first preliminary semiconductor fins 120-1 may be spaced apart, in the first direction, from one of the second preliminary semiconductor fins 120-2 at the distance of "D1" to define a pair of the preliminary semiconductor fins. Each of the pairs of preliminary semiconductor fins may be paced apart at the distance "D2" in the first direction. D2 may be greater than D1, such as 2 to 10 times greater or 3 to 5 times greater.

Figure 14:
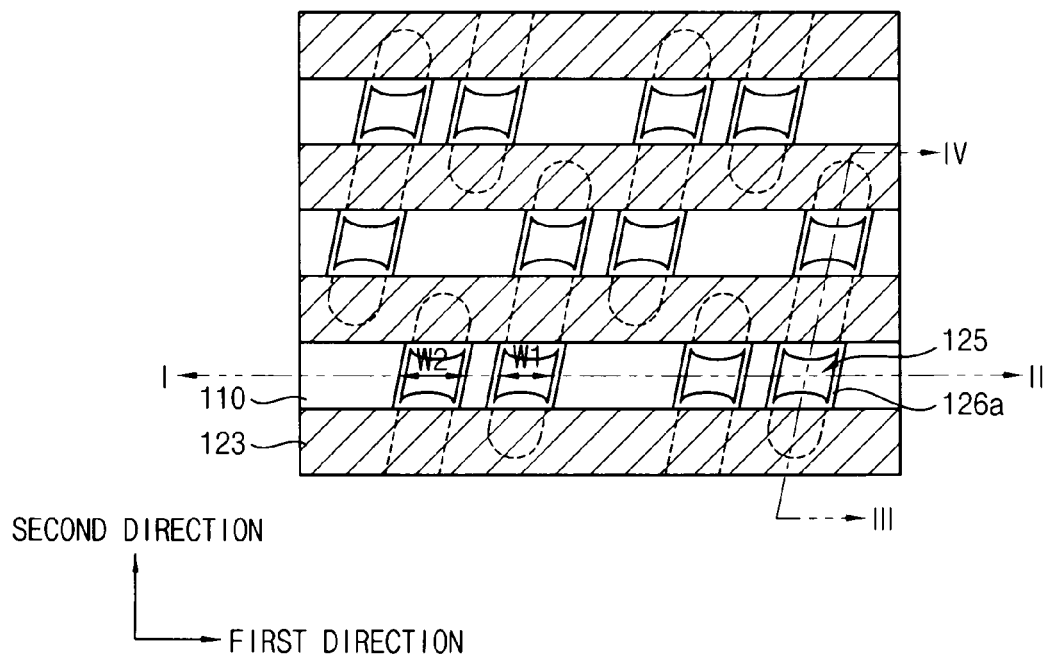
Figure 15:
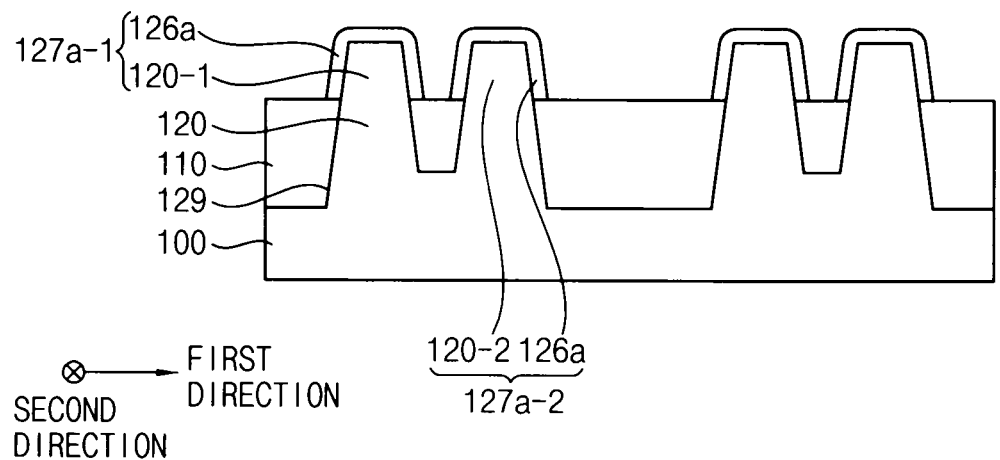
Figure 16:
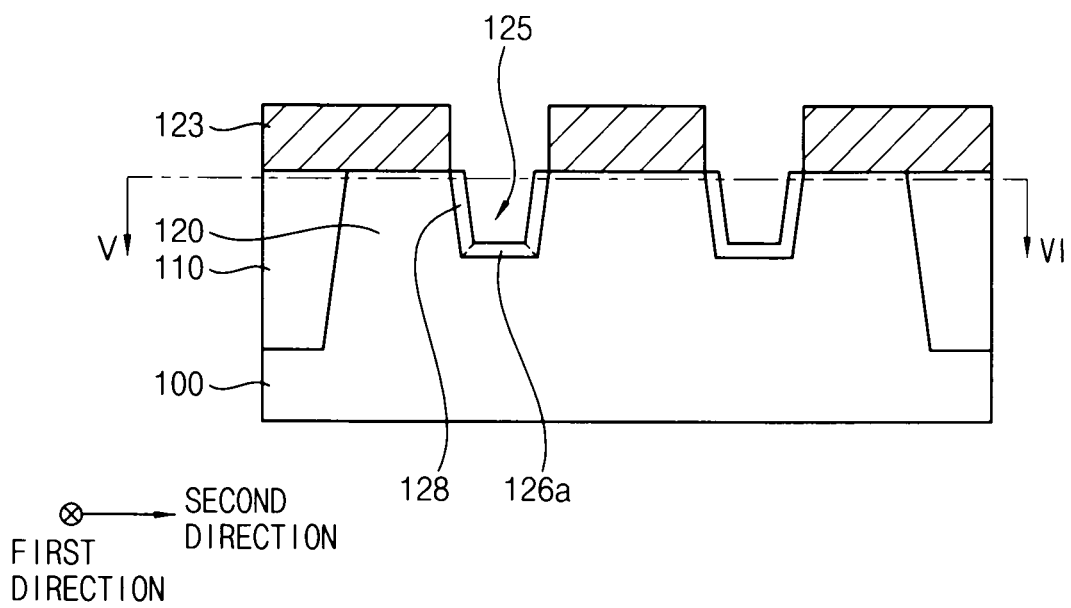

Referring to FIGS. 14, 15, 16, and 17, extended channels 126a may be formed to cover portions of the preliminary semiconductor fins 120-1 and 120-2. The extended channels 126a may extend upwardly from an upper surface of the device isolation layer 110. Referring to the exemplary embodiments, a channel layer may be formed, covering portions of the preliminary semiconductor fins 120-1 and 120-2 at the recess regions 125 and on the device isolation layer 110. For example, the channel layer may be formed by performing chemical vapor deposition (CVD), physical vapor deposition (PVD), and/or atomic layer deposition (ALD) processes to deposit polysilicon or epitaxially grow crystalline semiconductor material (which may be the same as or different from the material of the semiconductor substrate 100). Referring to FIGS. 14 and 15, a plurality of extended channels 126a isolated from one another may be formed by depositing a polysilicon layer on the structure shown in FIGS. 12 and 13 and anisotropic etching the deposited channel layer. Short circuiting between the active regions 120 may be prevented by segmenting and separating the channel layer between the first preliminary semiconductor fins 120-1 and the second preliminary semiconductor fins 120-2 via the etching process.

Referring to the exemplary embodiment, lowered semiconductor fin portions 127a-1, 127a-2 may include the extended channel 126a and the preliminary semiconductor fins 120-1, 120-2. As depicted in FIG. 14, lowered semiconductor fin portions 127a-1, 127a-2 may have wider width (W2) than the width (W1) of the portions of the active regions 120 which do not have the extended channel 126a formed thereon, and/or wider than the preliminary semiconductor fins 120-1, 120-2 (with respect to widths taken at the same height above the substrate 100).

Referring to FIG. 17, the extended channel 126a may be formed to extend from recess side surfaces 128 on both sides of recess region 125.

As stated above, after forming the recessed regions 125 for forming recessed channel transistors, channel regions may be extended by depositing the channel layer covering the portions of the preliminary semiconductor fins 120-1, 120-2 defining the recessed regions 125 and performing anisotropic etching on the deposited channel layer. The lowered semiconductor fin portions 127a-1, 127a-2 having a wider width by extending the preliminary semiconductor fins 120-1, 120-2 may be formed. The extended channel 126a may be formed on the opposing recess side surfaces 128 and the upper surface of the preliminary semiconductor fin 120-1 (120-2) connecting the side surfaces 128 which define the corresponding recessed region 125. Referring to the exemplary embodiments, a plurality of fin shaped active regions 120 may be formed, including fins shaped active regions 120 including the first lowered semiconductor fin portions 127a-1 and fin shaped active regions 120 including the second lowered semiconductor fin portions 127a-2.

The mask patterns 123 may be removed by performing ashing and/or a strip process.

Figure 18:
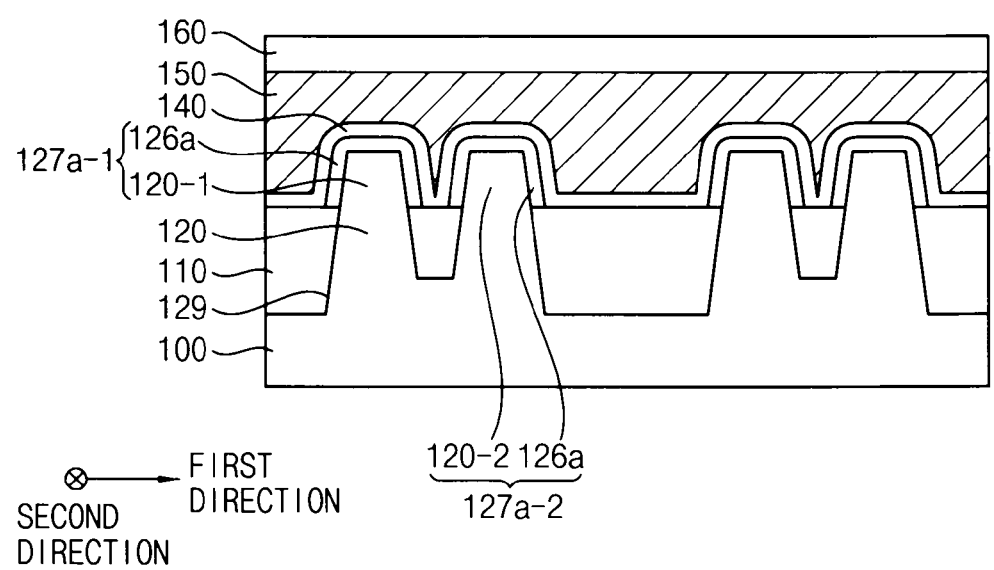
Figure 19:
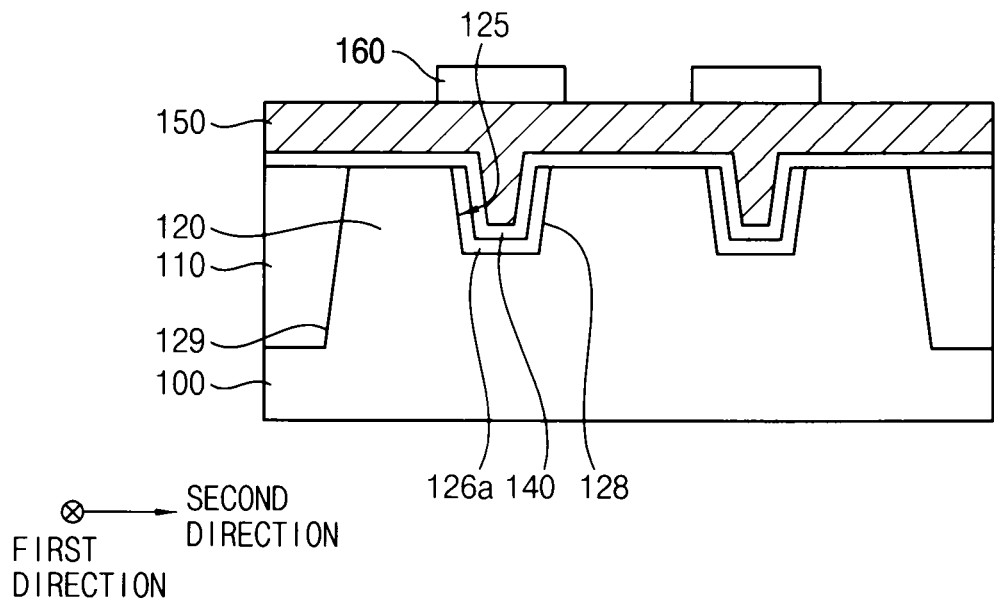

Referring to FIGS. 18 and 19, a gate insulating layer 140, a gate electrode layer 150, and a gate mask layer 160 may be sequentially formed on the device isolation layer 110 and the fin shaped the active regions 120 with the extended channels 126a.

The gate insulation layer 140 may be formed by performing a CVD process using silicon oxide or metal oxide. The gate insulating layer may also be formed by thermally oxidizing the upper surface of the fin shaped active regions 120 including the extended channels 126a. The gate electrode layer 150 may be formed by performing PVD, ALD, and/or a sputtering process using doped polysilicon, metal, or metal nitride. The remaining upper spaces of the recessed regions 125 may be filled with the gate electrode layer 150.

Gate mask patterns 160 may be formed by patterning a gate mask layer after forming the gate mask layer using silicon nitride through CVD process. Referring to the exemplary embodiments, the gate mask patterns 160 may extend along the first direction and may be formed to substantially cover the recess regions 125.

Figure 20:
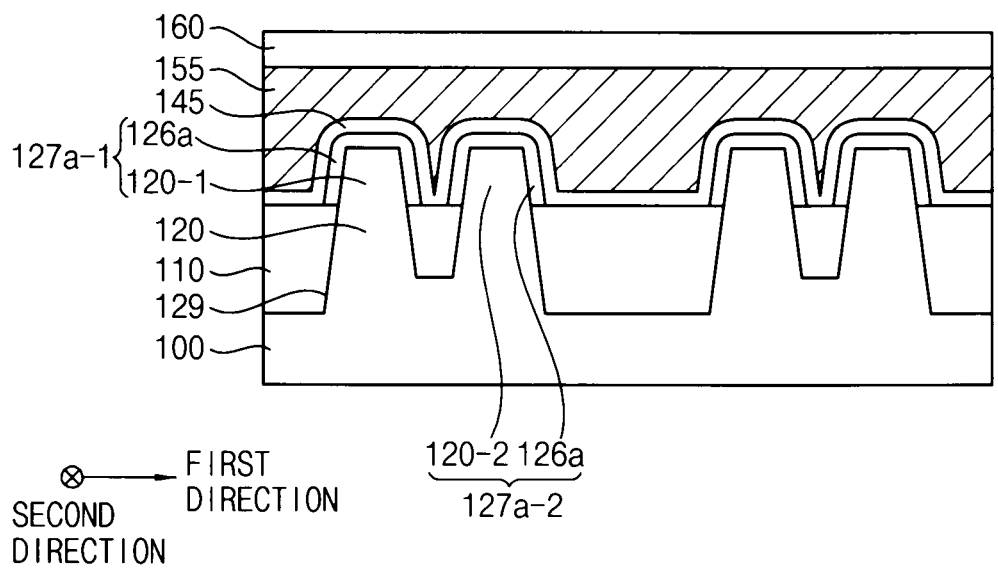
Figure 21:
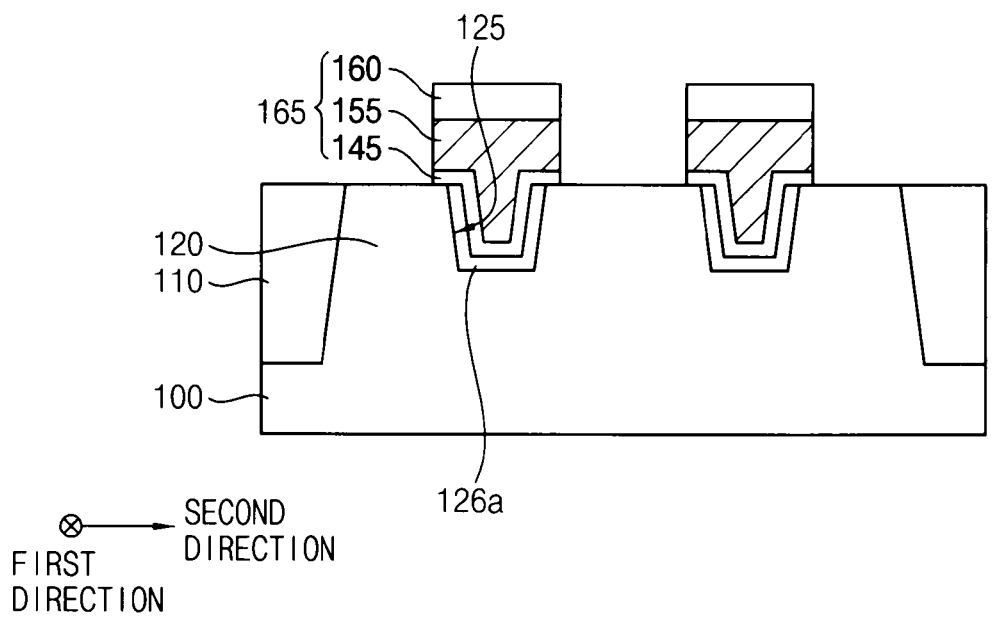

Referring to FIGS. 20 and 21, gate insulating patterns 145 and gate electrodes 155 filling the recess regions 125 below the gate mask patterns 160 may be formed by patterning (e.g., partially etching) the gate electrode layer 150 and the gate insulating layer 140 using the gate mask patterns 160 as a mask. Recessed gate structures 165 may thus be formed filling the recessed regions 125, the recessed gate structures 165 including the gate insulating patterns 145, the gate electrodes 155, and gate mask patterns 160.

Figure 22:
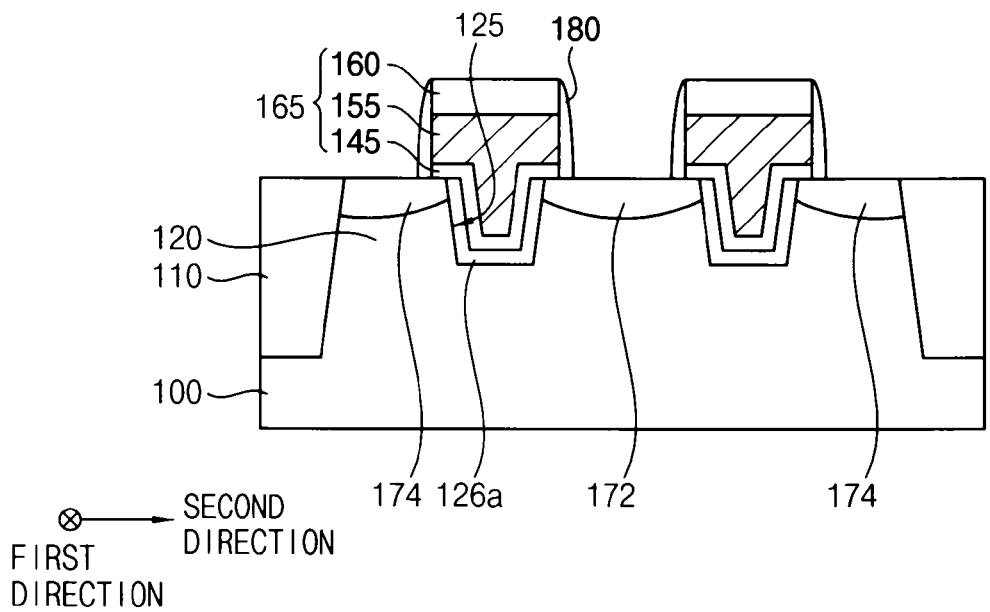

Referring to FIG. 22, first impurity regions 172 and second impurity regions 174 may be formed on the upper portion of the active regions 120 adjacent to the recessed gate structures 165 and recessed regions 125 by implanting impurities using the recessed gate structures 165 as a mask. Referring to the exemplary embodiments, recessed channel transistors including the first and the second impurity regions 172, 174 and the recess gate structures 165 may be formed. In the example of FIG. 22, two adjacent recessed channel transistors may be formed, sharing the first impurity region 172 as a shared a source/drain region.

Referring to the exemplary embodiments, the channel length of a transistor can be extended by using recessed channels. Buried FinFET structures may be formed at the lower portion of recessed regions 125 by forming the embedded gate structures 165 at the lowered semiconductor fin portions 127a-1, 127a-2 within the recessed regions 125. Channel regions may acquire extended width at the lowered semiconductor fin portions 127a-1, 127a-2 by use of the extended channels 126a. The extended channels 126a may also be formed on recess side surfaces 128 defining sides of the recessed regions 125. Therefore, high operating current may be acquired as the channel lengths and/or widths may be extended.

Referring to the exemplary embodiments, gate spacers 180 may be formed on both sides of the recess gate structures 165. For example, the gate spacers 180 may be formed by etching a gate spacer layer deposited to cover the recess gate structures 165 on the active regions 120 and the device isolation layer 110.

Figure 23:
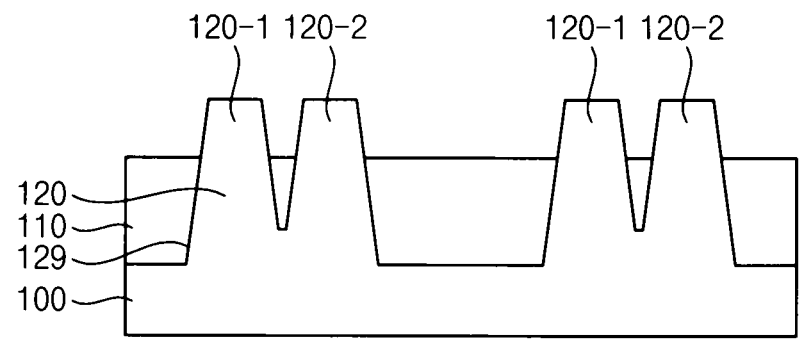
FIGS. 23 through 32 are plan views and cross-sectional views illustrating recessed channel transistors according to exemplary embodiments.
Figure 24:
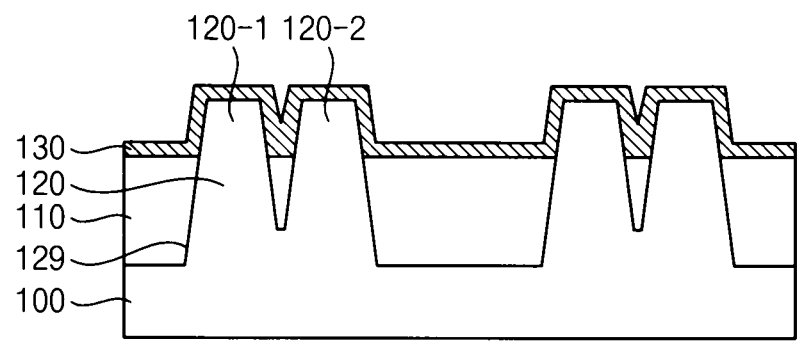
Figure 25:
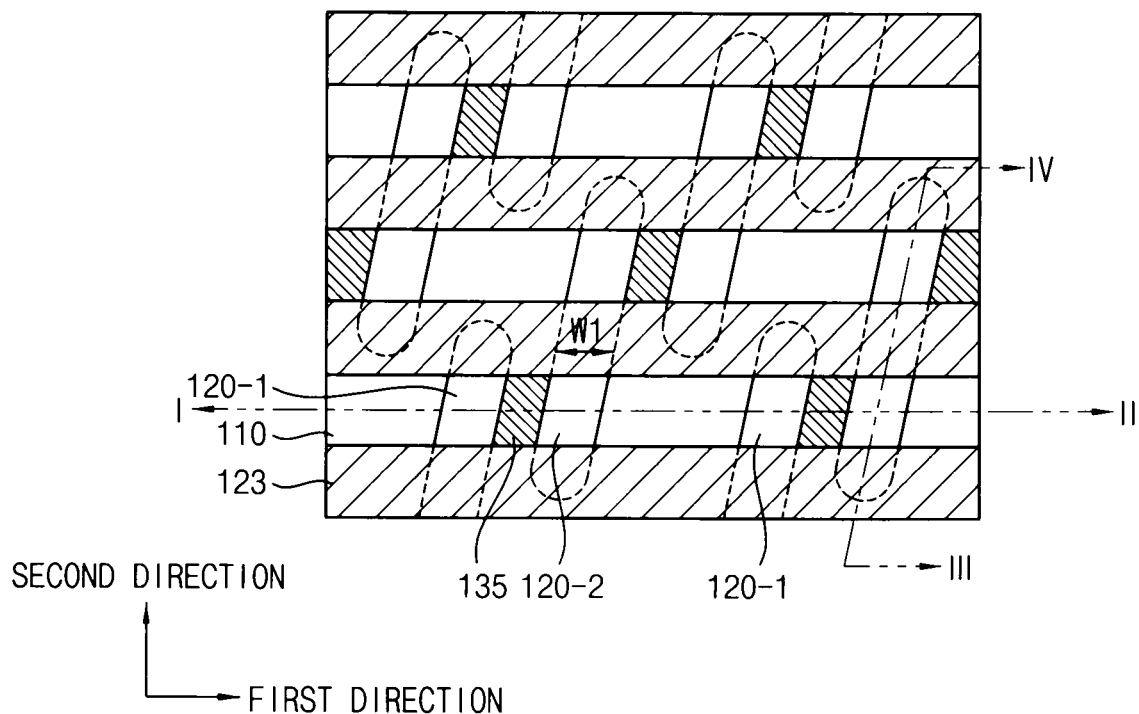
Figure 26:
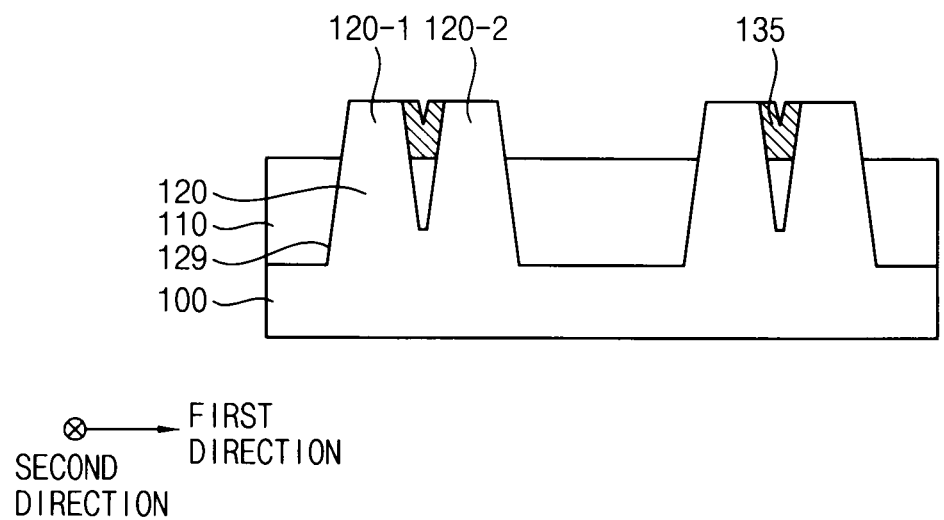
Figure 27:
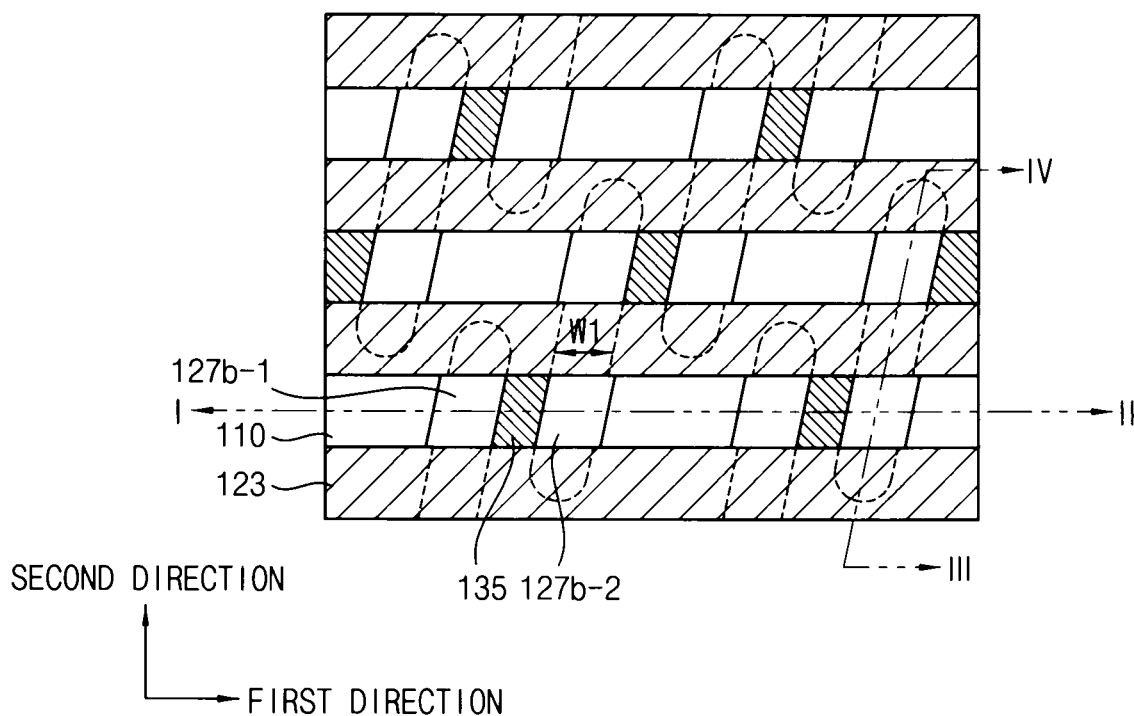
Figure 28:
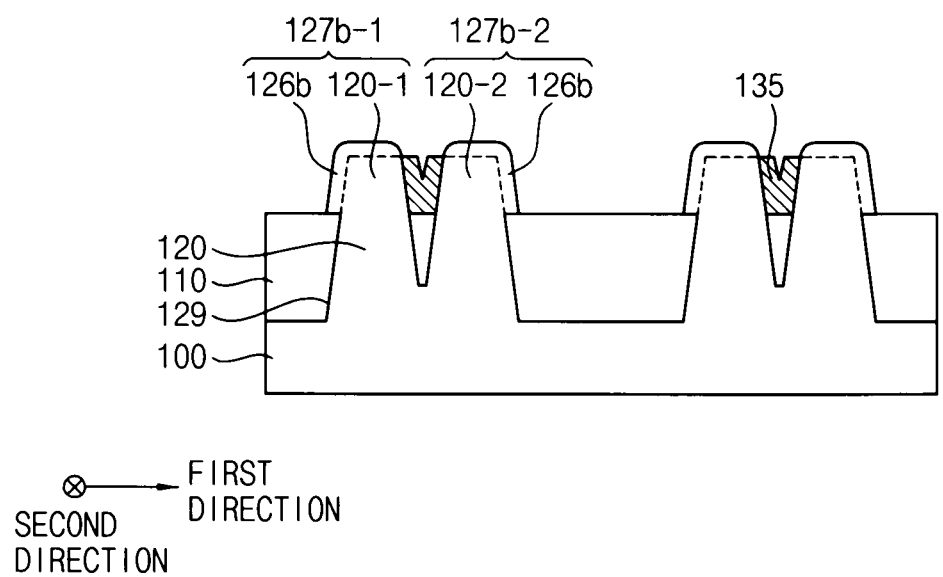
Figure 29:
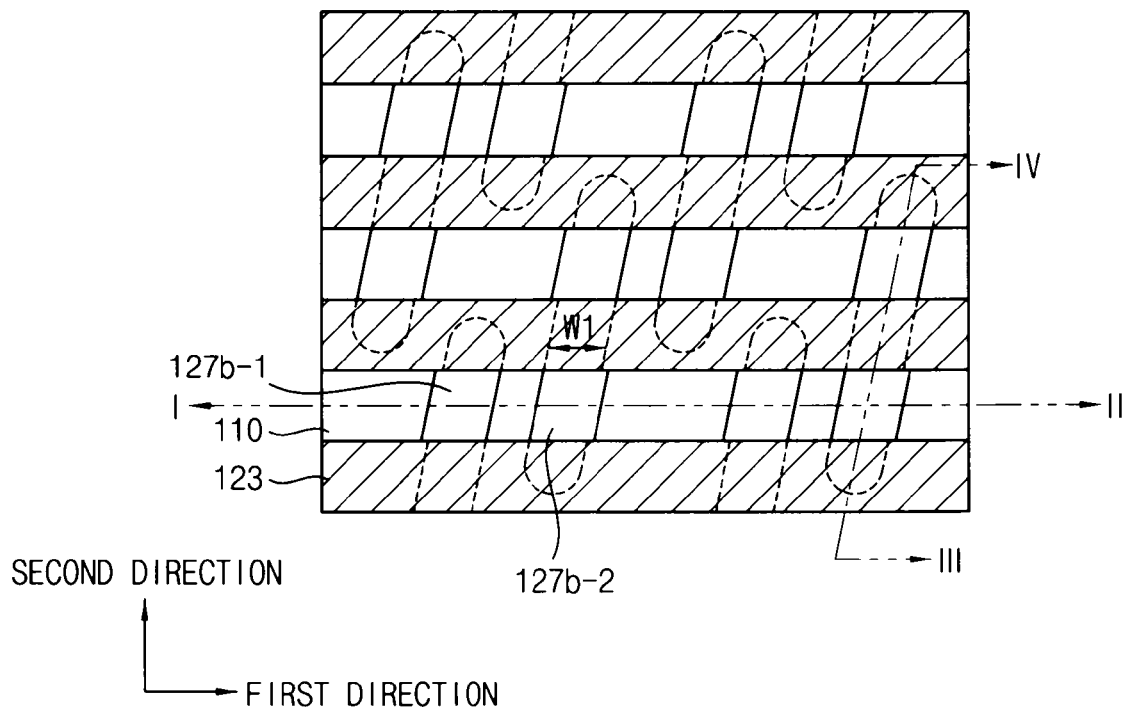
Figure 30:
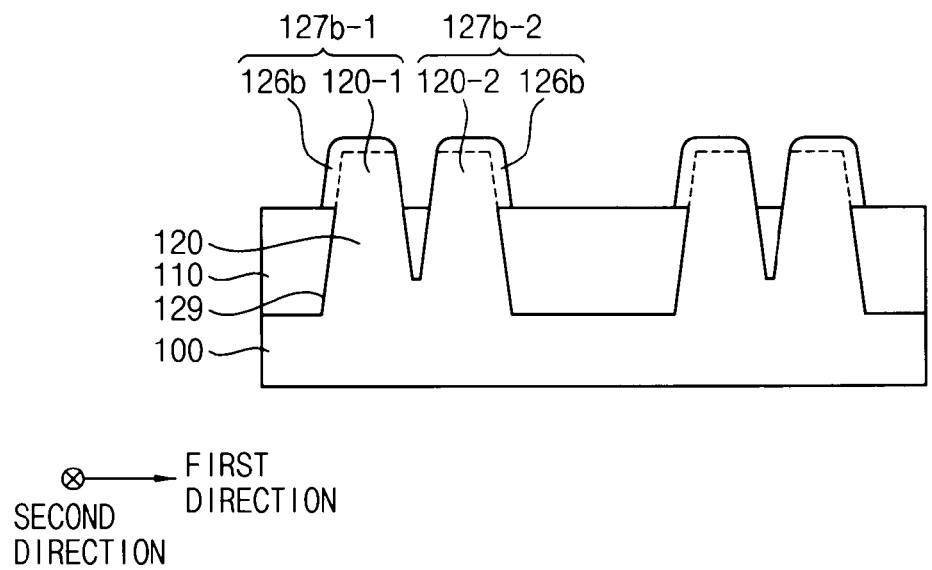
Figure 31:
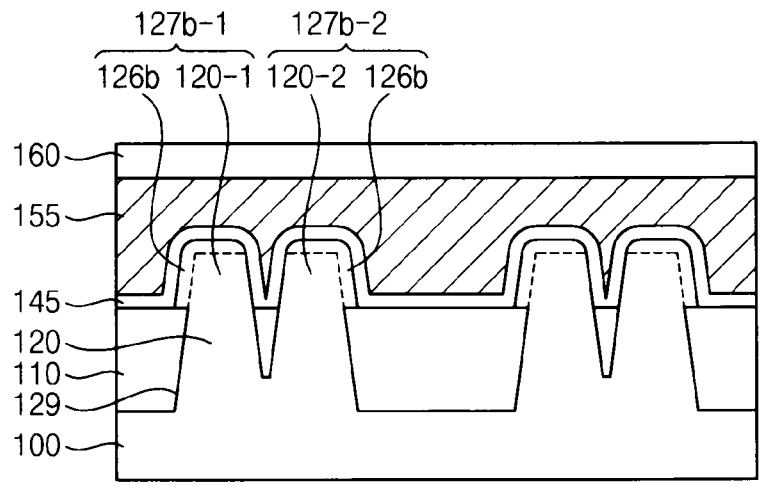
Figure 32:
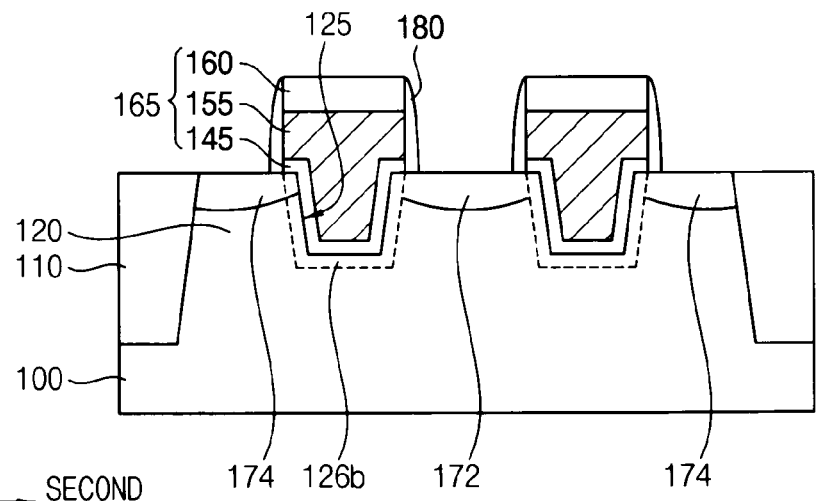

FIGS. 23 through 32 are plan views and cross-sectional views illustrating recessed channel transistors according to exemplary embodiments. FIGS. 25, 27, and 29 are plan views illustrating array of recessed channel transistor according to the exemplary embodiments. FIGS. 23, 24, 26, 28, 30, and 31 are cross-sectional views taken along line I-II lines of the plan views. FIG. 32 is a cross-sectional view taken along line III-IV lines of the plan views.

Referring to FIG. 23, the same or similar processes to processes explained in FIGS. 6 through 13 may be performed. Therefore, first preliminary semiconductor fins 120-1 and second preliminary semiconductor fins 120-2 having portions protruding from an upper surface of a device isolation layer 110 may be formed.

Referring to FIG. 24, a barrier layer 130 covering the first preliminary semiconductor fins 120-1 and the second preliminary semiconductor fins 120-2 may be formed on the device isolation layer 110. The barrier layer 130 may be formed by performing CVD, PECVD, LPCVD, and/or HDP-CVD processes using silicon nitride. Referring to the exemplary embodiments, spaces between the first preliminary semiconductor fins 120-1 and the second preliminary semiconductor fins 120-2 may be filled with the barrier layer 130. The barrier layer may be formed on the mask patterns 123 shown in FIGS. 11 and 12.

Referring to FIGS. 25 and 26, barrier layer patterns 135 filling the spaces between the more closely neighbored ones of (e.g. at a distance of "D1") the first preliminary semiconductor fins 120-1 and the second preliminary semiconductor fins 120-2 may be formed by partially etching the barrier layer 130. Referring to the exemplary embodiments, the barrier layer 130 may be removed until upper surfaces of the device isolation layer 110 and the preliminary semiconductor fins 120-1, 120-2 are exposed with portions of the barrier layer patterns 135 remaining between the more closely neighbored ones of the preliminary semiconductor fins 120-1, 120-2.

Referring to the exemplary embodiments, the barrier layer 130 may be partially removed by using etching solution or etching gas including phosphoric acid or sulfuric acid. Barrier layer patterns 135 may be formed by adjusting etching time in order to allow a portion of the barrier layer 130 to remain to fill the spaces between closely neighbored (e.g., at a distance "D1") ones of the first preliminary semiconductor fins 120-1 and the second preliminary semiconductor fins 120-2. Barrier layer portions formed on the mask patterns 123 and on the device isolation film 110 between more distantly neighbored (e.g., at a distance of "D2") ones of the first preliminary semiconductor fins 120-1 and the second preliminary semiconductor fins 120-2 may be removed.

Referring to FIGS. 27 and 28, extended channels 126b may be asymmetrically formed on the first and second preliminary semiconductor fins 120-1 120-2. For example, extended channels 126b may be formed on the respective upper surface of the lowered semiconductor fin portions 127b-1 and second lowered semiconductor fin portions 127b-2, and on just one of the sidewalls 129 of each of the lowered semiconductor fin portions 127b-1 and 127b-2. In this instance, extended channels 126b are formed on sidewalls 129 that face outwardly with respect to the more closely neighbored pair of transistors formed with the lowered semiconductor fin portions 127b-1 and 127b-2. Referring to the exemplary embodiments, semiconductor fins 127b-1, 127b-2 may be formed by epitaxially growing the extended channel 126b on exposed portions of the preliminary semiconductor fins 120-1, 120-2 (e.g., on portions except the portions of sidewalls 129 of the preliminary semiconductor fins 120-1, 120-2 covered with the barrier layer patterns 135 or covered with device isolation film 110). Alternatively, an extended channel layer may be deposited and etched to leave the extended channel 126b on exposed portions of the preliminary semiconductor fins 120-2, 120-2. Short circuiting between the fin shaped active regions 120 may be prevented by segmenting and separating the channel layer between neighboring the lowered semiconductor fin portions 127b-1, 127b-2 by the etching process.

Referring to the exemplary embodiments, the extended channels 126b of the lowered semiconductor fin portions 127b-1, 127b-2 may be formed by performing selective epitaxial growth (SEG) process. For example, the SEG process may be performed by using silicon-containing source gas, such as SiH2Cl2 or SiH4. The SEG process may be performed by using both the silicon-containing source gas and germanium-containing source gas, such as GeH4. The lowered semiconductor fin portions 127b-1, 127b-2 may include crystalline Si—Ge or other semiconductor material, such as that formed of a single crystal. The first lowered semiconductor fin portions 127b-1 may include respective first preliminary semiconductor fins 120-1 and respective extended channels 126b and the second lowered semiconductor fin portions 127b-2 may include respective second preliminary semiconductor fins 120-2 and respective extended channels 126b.

The extended channels 126b may be formed on opposing recess sides 128 of each of the recess regions 125, extending into the recess in the second direction (not shown).

Referring to FIGS. 29 and 30, the barrier layer patterns 135 may be removed. Referring to the exemplary embodiments, the barrier layer patterns 135 may be removed by using etching solution or etching gas including phosphoric acid or sulfuric acid.

Referring to FIGS. 31 and 32, recessed gate structures 165 embedded in the recessed regions 125 may be formed by performing the same or similar processes explained in FIGS. 20 to 22. The recessed gate structures 165 may include gate insulating patterns 145, gate electrodes 155, and gate mask patterns 160 sequentially deposited on the recessed regions 125.

First impurity regions 172 and second impurity regions 174 may be formed on the upper portion of the active regions 120 adjacent to the recessed gate structures 165 and recessed regions 125 by implanting impurities using the recessed gate structures 165 as a mask. Referring to the exemplary embodiments, gate spacers 180 may be formed on both sides of the recess gate structures 165.

FIGS. 33 through 37 are cross-sectional views illustrating recessed channel transistors according to exemplary embodiments.

Figure 33:
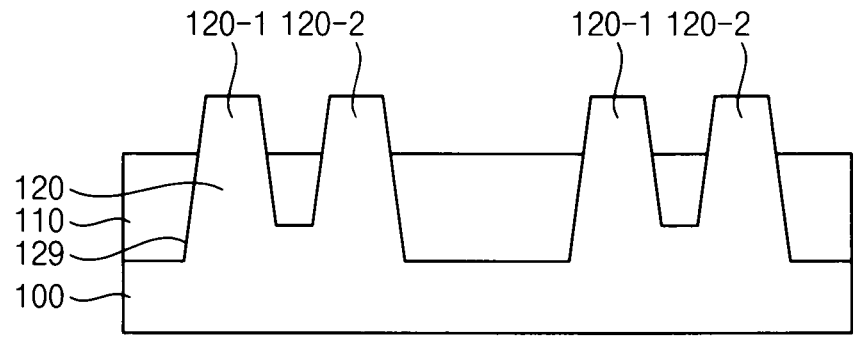
Referring to FIGS. 33 through 37 are cross-sectional views illustrating recessed channel transistors according to exemplary embodiments.

Referring to FIG. 33, the same or similar processes to processes explained in FIGS. 6 through 13 may be performed. Therefore, first preliminary semiconductor fins 120-1 and second preliminary semiconductor fins 120-2 having portions protruding from an upper surface of a device isolation layer 110 may be formed.

Figure 34:
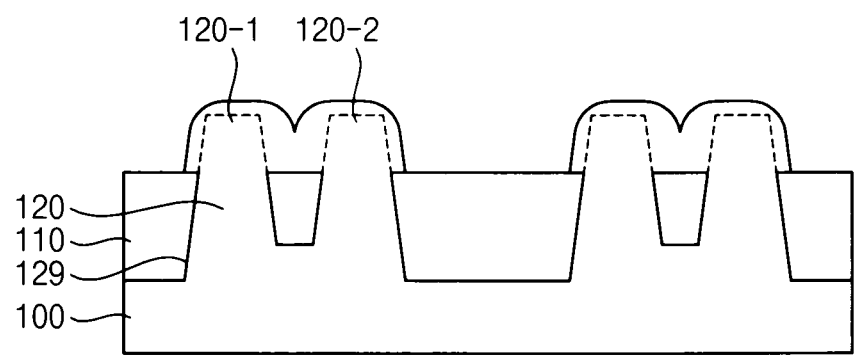

Referring to FIG. 34, a selective epitaxial growth (SEG) process may be performed on the exposed portions of the first preliminary semiconductor fins 120-1 and the exposed portions of the second preliminary semiconductor fins 120-2 (e.g, using these portions as a seed or seed layer for SEG). Therefore, the first preliminary semiconductor fins 120-1 and the second preliminary semiconductor fins 120-2 may be extended. Referring to FIG. 34, facing side walls 129 of the extended first preliminary semiconductor fins 120-1 and the extended second preliminary semiconductor fins 120-2 facing each other may come into contact with each other.

Referring to the exemplary embodiments, the SEG process may be performed using silicon-containing source gas, for example SiH2Cl2 or SiH4. The SEG process may be performed by using the silicon-containing source gas and germanium-containing source gas, such as GeH4.

Figure 35:
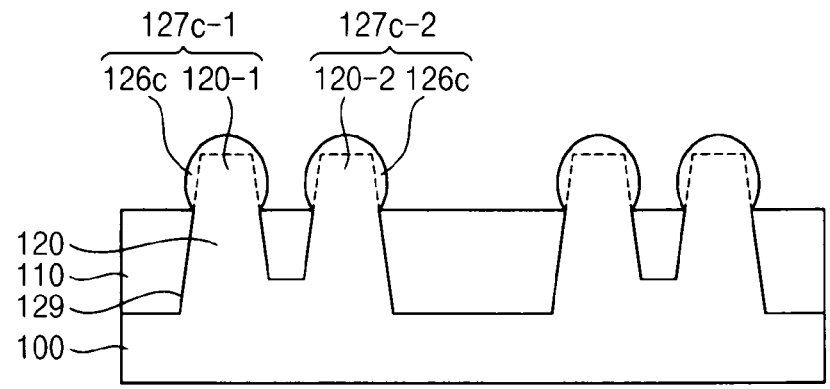

Referring to FIG. 35, the first lowered semiconductor fin portions 127c-1 and the second lowered semiconductor fin portions 127c-2 may be formed to segment and separate their respective extended channels 126c by partially etching extended the first preliminary semiconductor fins 120-1 and the second preliminary semiconductor fins 120-2. In some examples, the extended the first preliminary semiconductor fins 120-1 and the second preliminary semiconductor fins 120-2 may be partially removed by performing anisotropic etching process. In some examples, the process etching the extended the first preliminary semiconductor fins 120-1 and the second preliminary semiconductor fins 120-2 may be performed in-situ using etching gas such as HCl in a chamber which also performs the SEG process. The first lowered semiconductor fin portions 127c-1 may include the first preliminary semiconductor fins 120-1 and the extended channels 126c and the second lowered semiconductor fin portions 127c-2 may include the second preliminary semiconductor fins 120-2 and the extended channels 126c. The extended channels may have a rounded cross section corresponding to cross section I-II of FIG. 27 (that may have substantially the same radius of curvature in some examples) (e.g., as shown in FIGS. 35 and 36).

The extended channels 126c s may be simultaneously formed on sidewalls 129 of the first and second lowered semiconductor fin portions 127c-1, 127c-2 and on opposing recess side surfaces the recessed regions 125. Therefore, the fin shaped active regions 120 including the first lowered semiconductor fin portions 127c-1 and the second lowered semiconductor fin portions 127c-2 and the side semiconductor fins may be formed.

Figure 36:
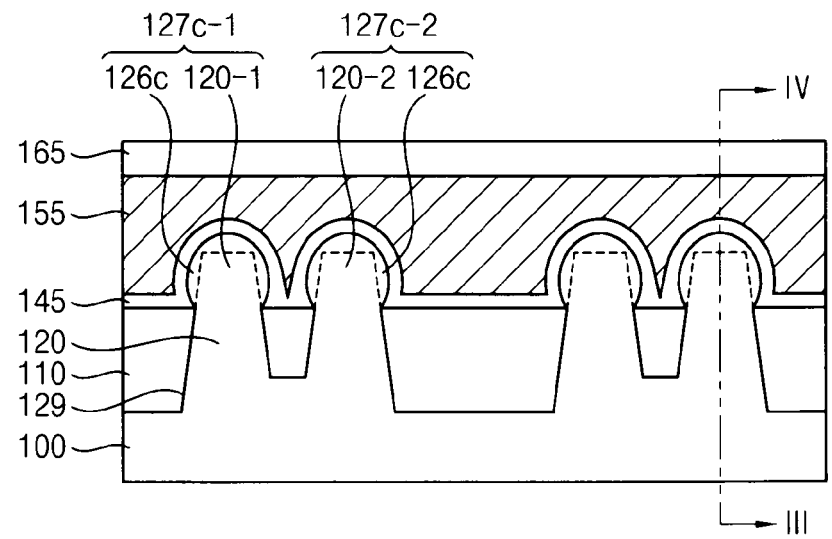
Figure 37:
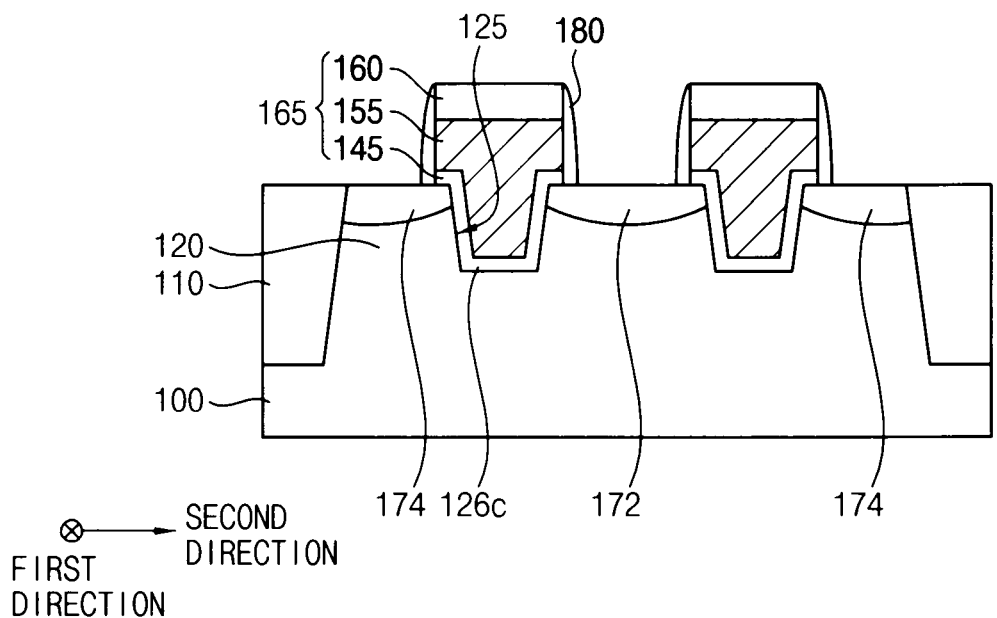

Referring to FIGS. 36 and 37, recess gate structures 165 burying the recess regions 125 may be formed by performing the same or similar processes explained in FIGS. 20 to 22. The recess gate structures 165 may include gate insulating patterns 145, gate electrodes 155, and gate mask patterns 160 sequentially deposited on the recess regions 125.

First impurity regions 172 and second impurity regions 174 may be formed on the upper portion of the active regions 120 adjacent to the recess gate structures 165 and recess regions 125 by implanting impurities using the recess gate structures 165 as a mask. Referring to the exemplary embodiments, gate spacers 180 may be formed on both sides of the recess gate structures 165.

Referring to FIGS. 38 through 44 are plan view and cross-sectional views illustrating recess channel transistor according to exemplary embodiments.

Figure 38:
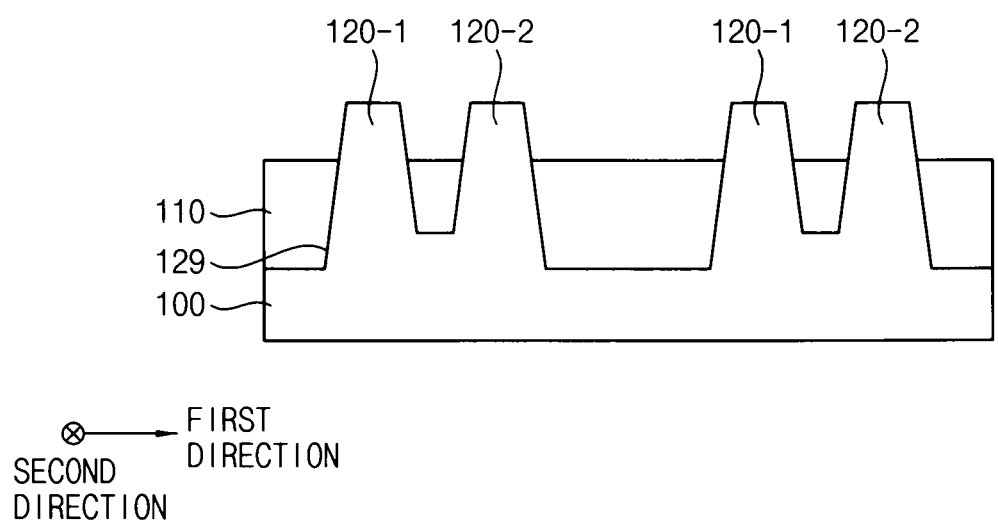
FIGS. 38 through 44 are plan view and cross-sectional views illustrating recessed channel transistors according to exemplary embodiments.

Referring to FIG. 38, the same or similar processes to processes explained in FIGS. 6 through 13 may be performed. Therefore, first preliminary semiconductor fins 120-1 and second preliminary semiconductor fins 120-2 having portions protruding from upper surface of a device isolation layer 110 may be formed.

Figure 39:
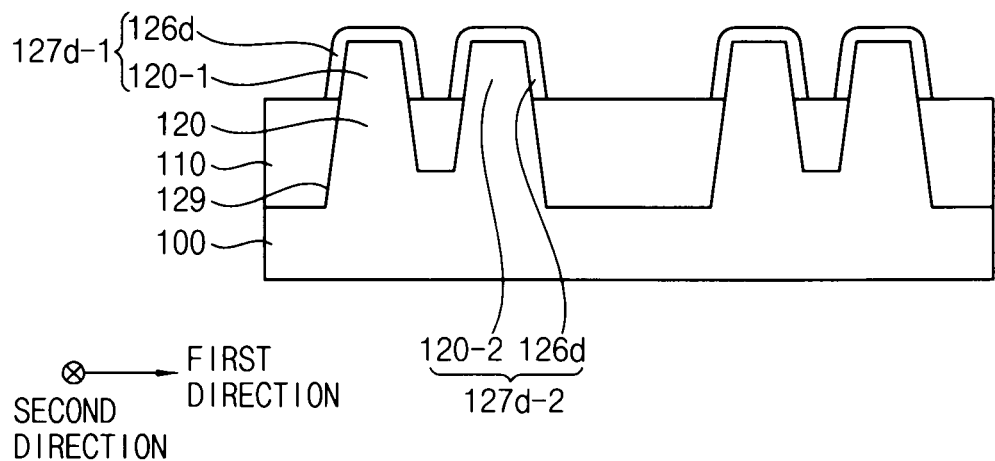
Figure 40:
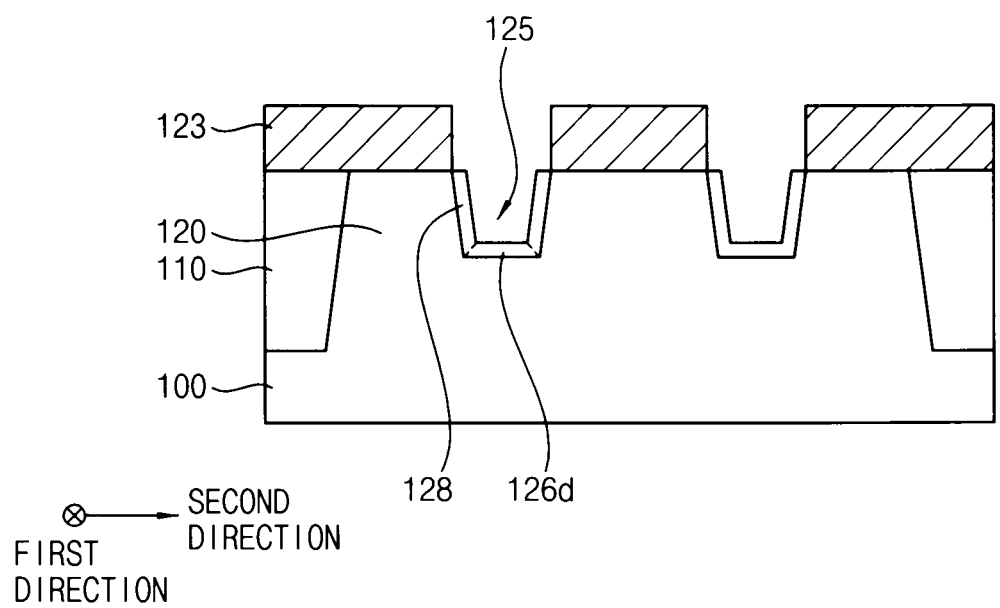

Referring to FIGS. 39 and 40, the same or similar processes to processes explained in FIGS. 14 through 17 may be performed. Extended channels 126d covering opposite side walls 129, opposing recess side surfaces 128 of recessed region 125 and respective upper surfaces of the lowered semiconductor fins 127d-1, 127d-2 interposed between respective ones of these surfaces may be formed.

Figure 41:
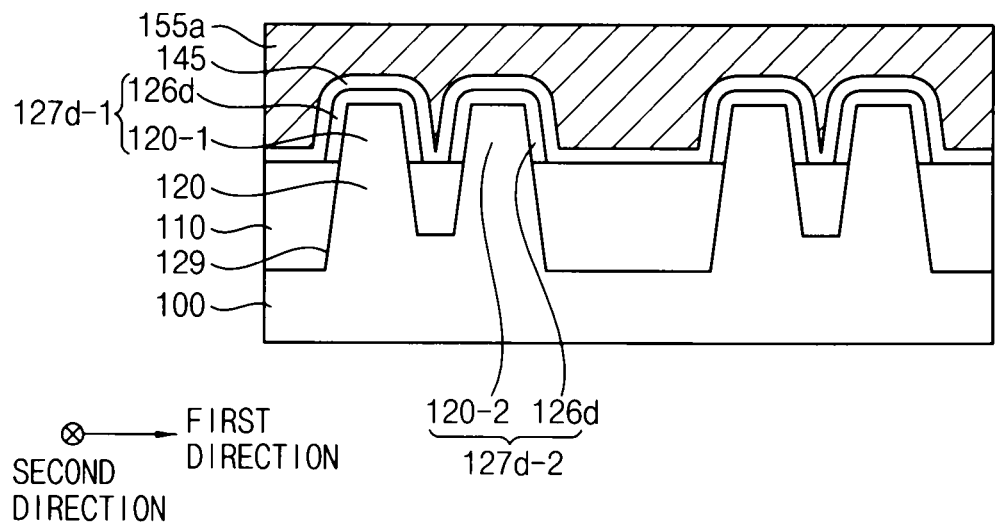
Figure 42:
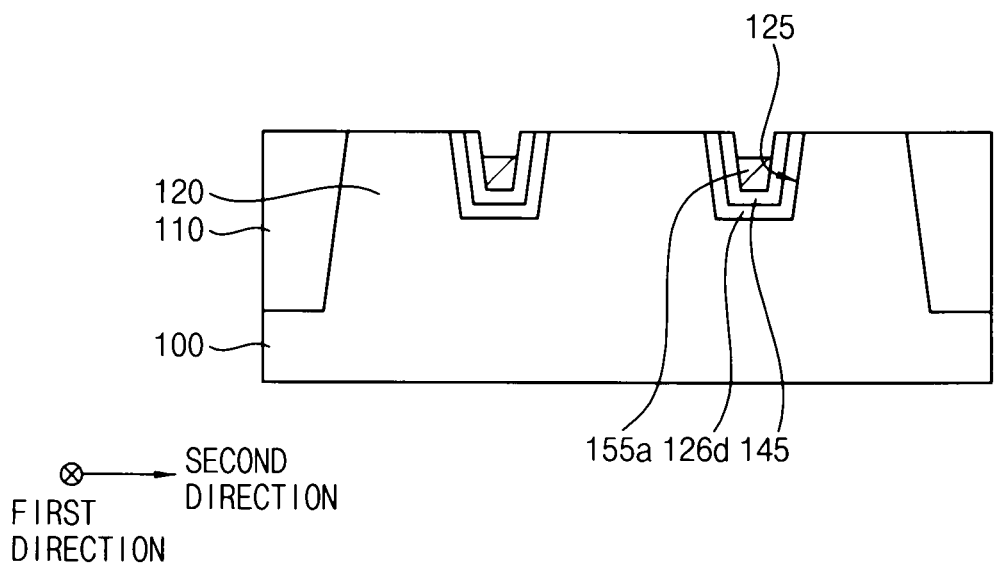

Referring to FIGS. 41 and 42, gate insulating patterns 145 and gate electrodes 155a may be formed on the device isolation layer 110, the active regions 120, and the extended channels 126d. The gate insulating patterns 145 and the gate electrodes 155a may be formed by partially removing a gate insulating layer and a gate electrode layer after the gate insulating layer and gate electrode layer may be formed on the device isolation layer 110, the active regions 120, and the extended channels 126d.

Referring to the exemplary embodiments, the gate insulating layer may be formed by performing a CVD process using silicon oxide and/or metal oxide. Alternatively, the gate insulating layer may be formed by thermally oxidizing the upper surfaces of the active regions 220 and the extended channels 226.

Referring to the exemplary embodiments, the gate electrode layer may be formed by performing PVD, ALD, and sputtering processes using doped polysilicon, metal, or metal nitride. The rest of the recess regions 125 may be filled with the gate electrode layer 150.

The gate insulating patterns 145 and the gate electrodes 155a may be formed by removing upper surfaces of the gate insulating layer 140 and the gate insulating layer 150. Referring to the exemplary embodiments, the gate insulating patterns 145 may be formed by planarizing the upper surfaces of the gate insulating layer 140 and the gate insulating layer 150 until upper surfaces of the active regions 120 are exposed through chemical mechanical polishing (CMP) process. This chemical mechanical polishing process may also act to expose upper surfaces of the device isolation film 110. After the chemical mechanical polishing, portions of the gate electrode layer 150 may remain within recess region 125 at a height substantially the same as the upper surfaces of the active regions 120 and device isolation film 110 (e.g., the portions of the gate electrode layer 150 may be substantially co-planar with the upper surfaces of the active regions 120 and device isolation film 110). The gate electrodes 155a may be formed by removing an upper portion of the gate electrode layer within the recess regions 125 through anisotropic etching process. For example, upper surfaces of the gate electrodes 155a may be lower than the upper surfaces of the surface 100, such as lower than upper surfaces of the active regions 120 and/or device isolation film 110.

Figure 43:
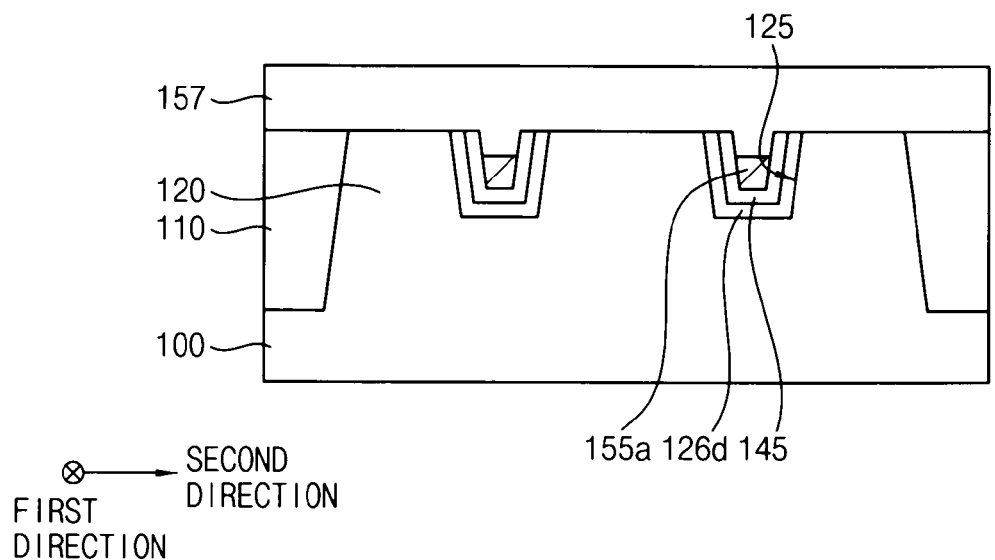

Referring to FIG. 43, capping layer patterns 158 embedded in upper portions of the recessed regions 125 may be disposed on the substrate 100, the extended channels 126d, the gate insulating patterns 145, and the gate electrodes 155a. The capping layer patterns 158 may comprise silicon oxide.

Figure 44:
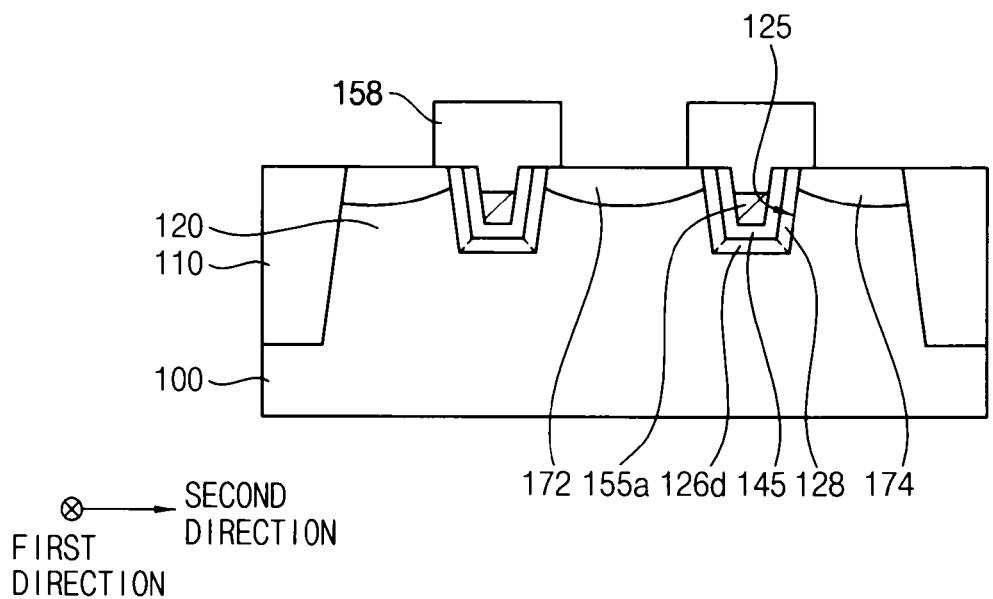

Referring to FIG. 44, capping layer patterns 158 and impurity regions may be formed by partially removing the capping layer 157. Referring to the exemplary embodiment, the capping layer patterns 158 may be formed by forming a patterned mask (e.g., a patterned photoresist mask) and patterning the capping layer 157 through wet etching or dry etching process using the patterned mask.

First impurity regions 172 and second impurity regions 174 may be formed on the upper portion of the substrate 100 adjacent to recess regions 125 by implanting impurities using the capping layer patterns 158 as a mask. Impurities may diffuse laterally after implantation. Referring to the exemplary embodiments, recess channel transistors including the gate electrodes 155a, the gate insulating patterns 145, and the first and the second impurity regions 172, 174 may be formed.

Referring to FIGS. 45 through 48 are cross-sectional views illustrating recess channel transistor according to exemplary embodiments.

Figure 45:
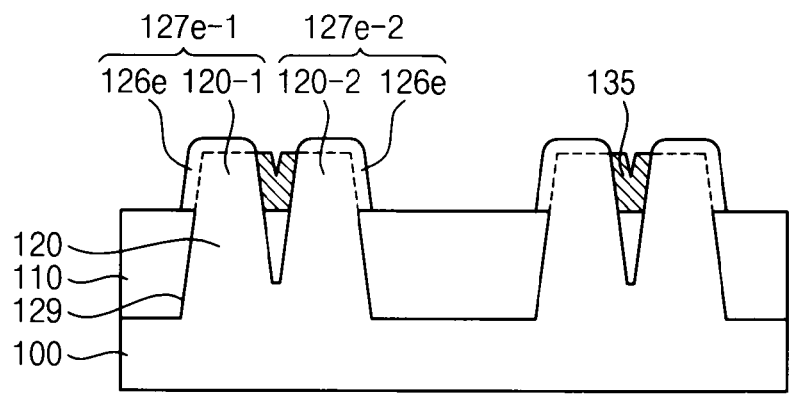
Referring to FIGS. 45 through 48 are cross-sectional views illustrating recessed channel transistors according to exemplary embodiments.
Figure 46:
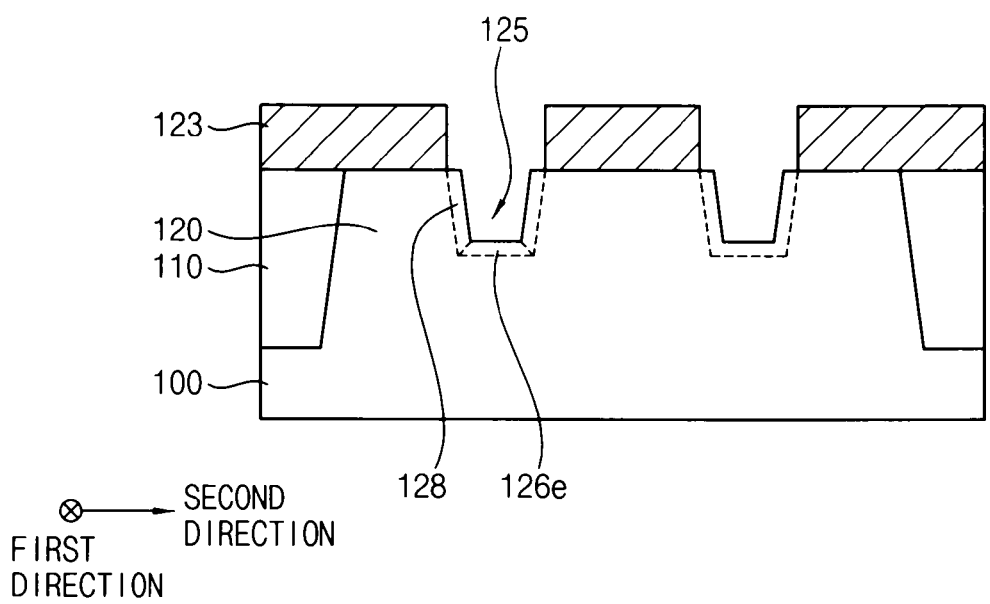

Referring to FIGS. 45 and 46, the same or similar processes as processes explained in FIGS. 23 through 30 may be performed. First preliminary semiconductor fins 120-1 and second preliminary semiconductor fins 120-2 having portions protruding from an upper surface of a device isolation layer 110 may be formed. Extended channels 126e covering side surfaces at the recessed region 125 and recess side surfaces 128 defining the recessed region 125 may be formed on corresponding preliminary semiconductor fins 120-1, 120-2. First lowered semiconductor fin portions 127e-1 may include the first preliminary semiconductor fins 120-1 and the extended channels 126e and second lowered semiconductor fin portions 127e-2 may include the second preliminary semiconductor fins 120-2 and the extended channels 126e. Cross sections of the first and second lowered semiconductor fin portions 127e-1, 127e-2 (and corresponding fin shaped active regions 120) may be asymmetrical, such as along line I-II in FIG. 29 through recessed regions 125. The shape of the first and second lowered semiconductor fin portions 127e-1, 127e-2 (and corresponding fin shaped active regions 120) may be the same as that described above with respect to FIGS. 23 through 30.

Figure 47:
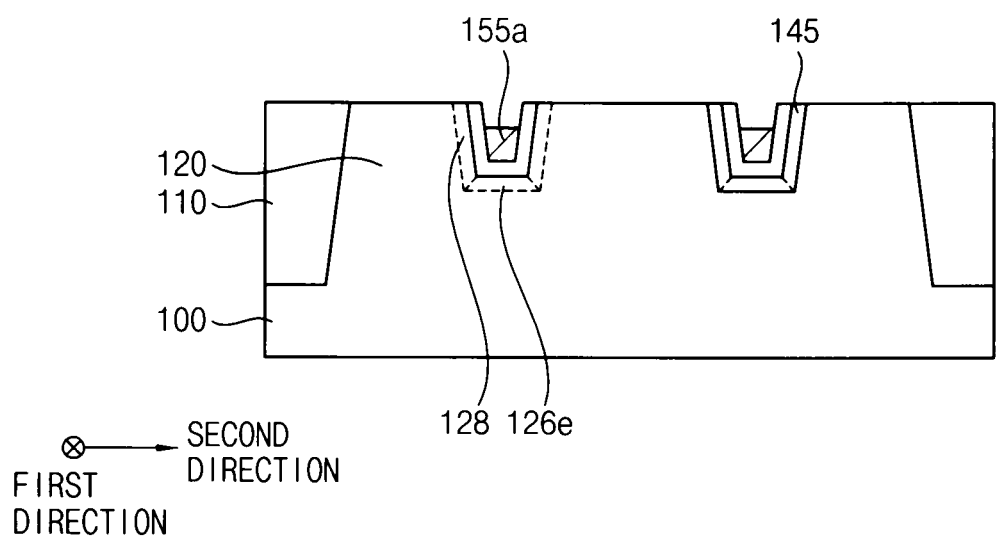

Referring to FIG. 47, the same or similar processes to processes explained in FIGS. 41 and 42 may be performed. Gate insulating patterns 145 and gate electrodes 155a may be formed on the extended channels 126e.

Figure 48:
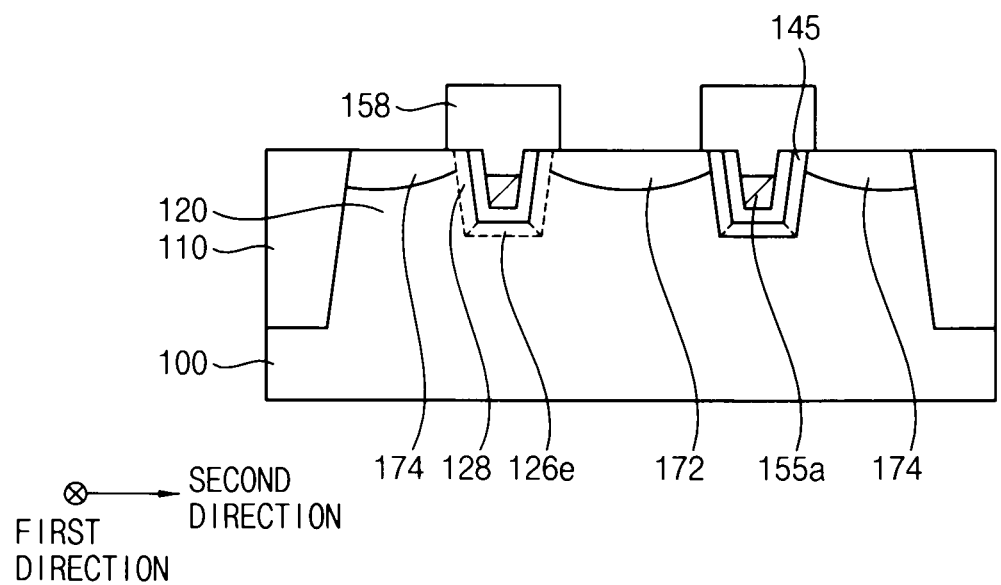

Referring to FIG. 48, the same or similar processes to processes explained in FIG. 44 may be performed. Recessed channel transistors may be acquired by forming capping layer patterns 158, first impurity regions 172, and second impurity regions 174.

FIGS. 49 to 54 are cross-sectional views illustrating a method of manufacturing a semiconductor device according to exemplary embodiments. For example, the semiconductor device may be DRAM device including recessed channel transistors according to the exemplary embodiments.

Figure 49:
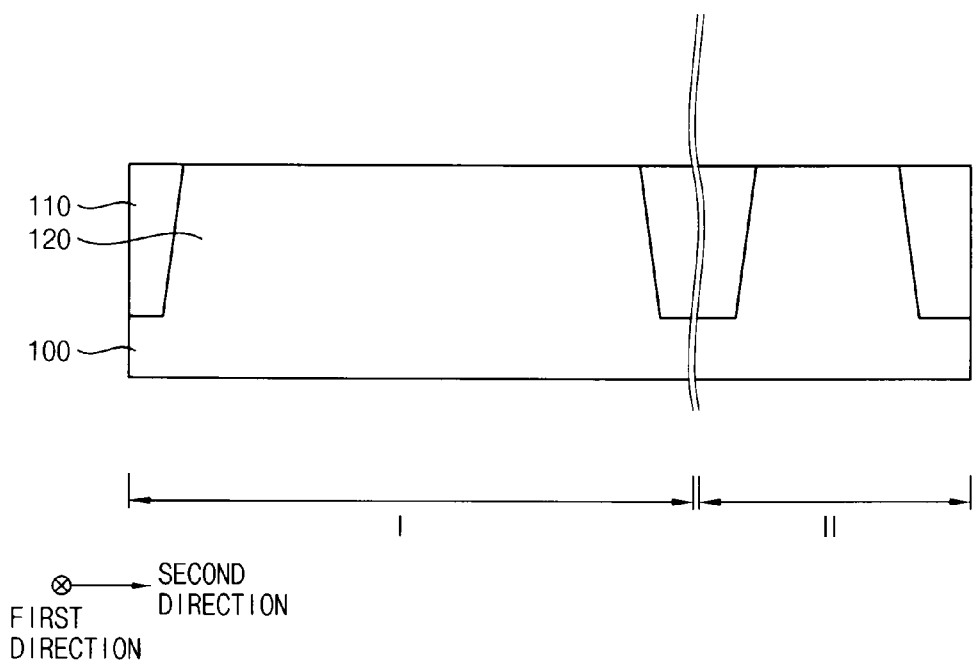
FIGS. 49 to 54 are cross-sectional views illustrating a method of manufacturing a semiconductor device according to exemplary embodiments.

Referring to FIG. 49, a substrate 100 may include active regions 120 and a device isolation layer 110. According to the exemplary embodiments, the first region (I) may be a cell region memory cells are formed and the second region (II) may be a peripheral region.

Figure 50:
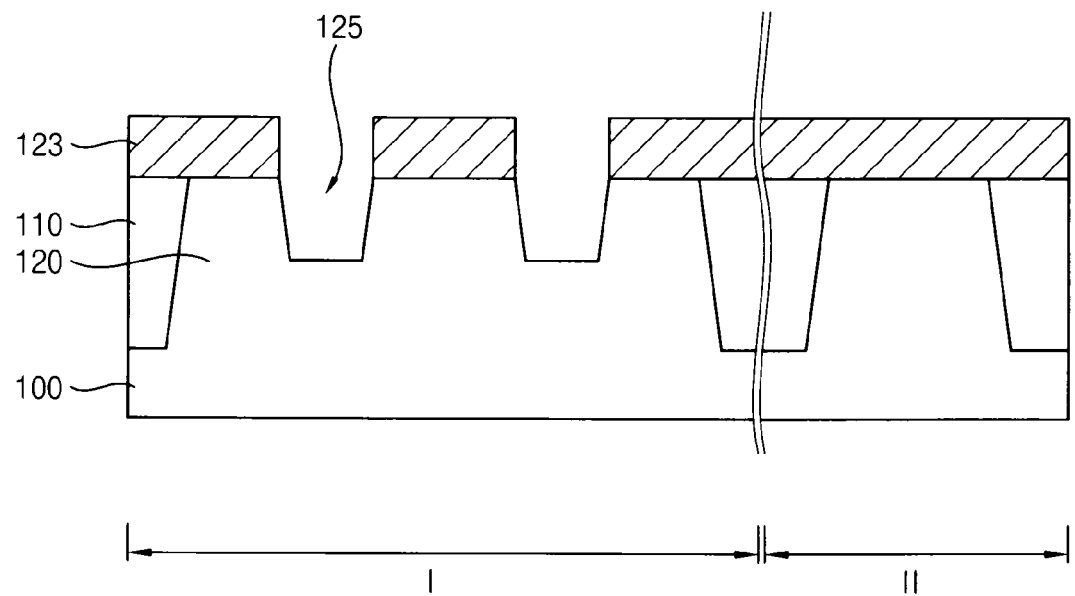

Referring to FIG. 50, recess regions 125 in the active regions 120 of the first region (I) may be formed by performing the same or similar processes as processes explained in FIGS. 6 through 11. According to the exemplary embodiments, mask patterns 123 partially exposing the active regions 120 corresponding to recess regions 125 locations may be formed. The recessed regions 125 may be formed by partially etching the active regions 120 using the mask patterns 123 as a mask.

Figure 51:
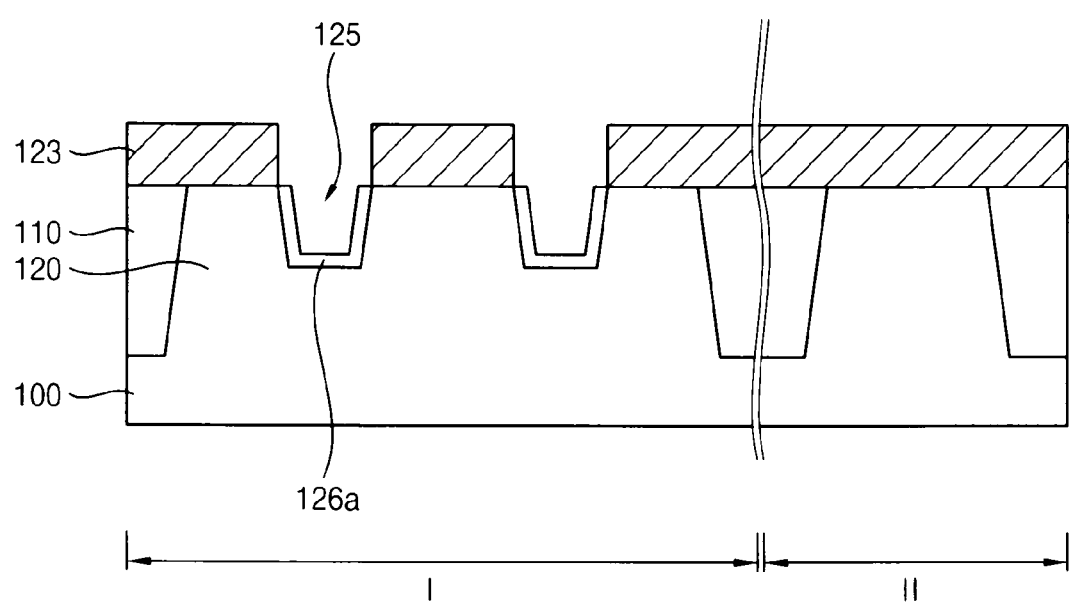

Referring to FIG. 51, extended channels 126a covering the recessed regions 125 may be formed by performing the same or similar processes as processes explained in FIGS. 12 through 17. The mask patterns 123 may be removed through ashing and/or a stripping process.

Figure 52:
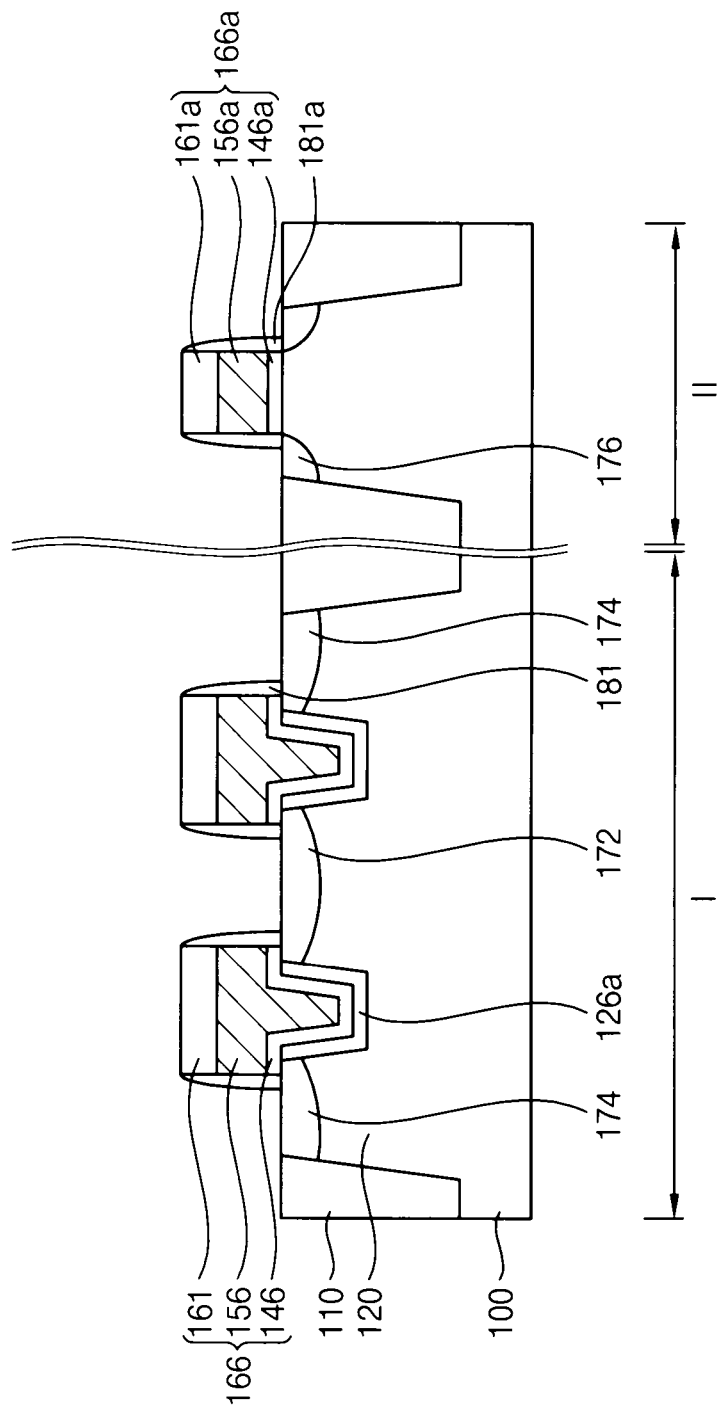

Referring to FIG. 52, first gate structures 166 filling the recess regions 125 may be formed by performing the same or similar processes as processes explained in FIGS. 18 through 22. The first gate structures 166 may have substantially same structure with recessed gate structures 165 shown in FIG. 19. Gate electrodes 156 may be word lines. Second gate structures 166a (only one being shown for ease of communication) may be formed in the second region (II). The first gate structures 166 may include first gate insulating patterns 146, first gate electrodes 156, and first gate mask patterns 161 stacked sequentially on the recessed regions 125 of the first region (I). The second gate structures 166a may include second gate insulating patterns 146a, second gate electrodes 156a, and second gate mask patterns 161a stacked sequentially on of the substrate 100 in the second region (II).

Impurity regions may be formed on the upper portion of the active regions 120 adjacent to the gate structures 166, 166a by implanting impurities using the first gate structures 166 and the second gate structures 166a as a mask. The impurity regions may include the first and the second impurity regions 172, 174 formed in the active regions 120 of the first region (I) and third impurity regions 176 formed in the active regions 120 of the second region (II).

Spacer layer may be formed on the substrate 100 covering the first and the second gate structures 166, 166a. First spacers 181 and second spacers 181a may be respectively formed on both sides of the first gate structures 166 and the second gate structures 166a by performing anisotropic etching the spacer layer.

Figure 53:
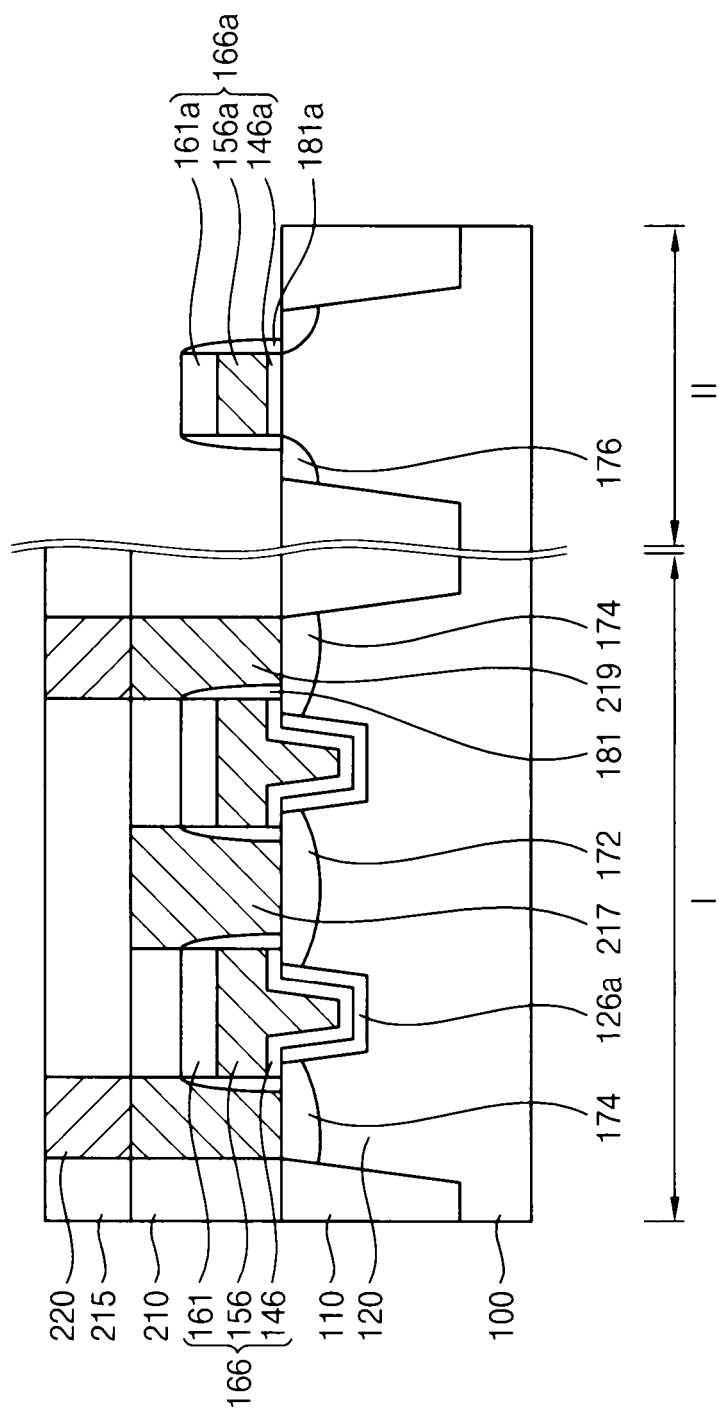

Referring to FIG. 53, first interlayer insulating film 210 covering the gate structures 166 may be formed on the substrate of the first region (I). First holes (filled with plugs 217 and 219 in FIG. 53) exposing the first and the second impurity regions 172, and 174 may be formed by partially etching the first interlayer insulating film. The first holes may be self aligned to the first gate structures 166 and the first spacers 181.

A first conductive layer filling the first holes may be formed on the first interlayer insulating film 210. First plugs 217 and the second plugs 219 may be formed within the first holes by removing an upper surface of the first conductive layer through CMP and/or an etch-back process until the upper surface of the first interlayer insulating film 210 is exposed. The first plugs 217 may contact the first impurity regions 172 and the second plugs 219 may contact the second impurity regions 174. The first conductive layer may include doped polysilicon and/or metal. The first plugs 217 may be used as a bit line contact. A second conductive layer (not shown) contacting the first plugs 217 may be formed on the first interlayer insulating film 210 and bit lines (not shown) may be formed by patterning the second conductive layer.

A second interlayer insulating film 215 covering the bit lines may be formed on the first interlayer insulating film 210. Second holes (filled with plugs 220 in FIG. 53) exposing the second plugs 219 may be formed by partially etching the second interlayer insulating film 215. A third conductive layer filling the second holes may be formed on the second plugs 219 and the second interlayer insulating film 215. Third plugs 220 may be formed within the second holes by removing an upper surface of the third conductive layer through CMP and/or etching back process until an upper surface of the second interlayer insulating film 215 is exposed. The second and third plugs 219 and 220 may be used as a capacitor contact. The second and third plugs 219 and 220 may connect to a capacitor that may store charge as data of a corresponding DRAM memory cell. In an alternative embodiment, third plugs 220 may penetrate the first and the second interlayer insulating films 210, 215 contacting the second impurity regions 174, making the formation of the second plugs 219 unnecessary. In this case, the third plugs 220 may be used as a capacitor contact.

Figure 54:
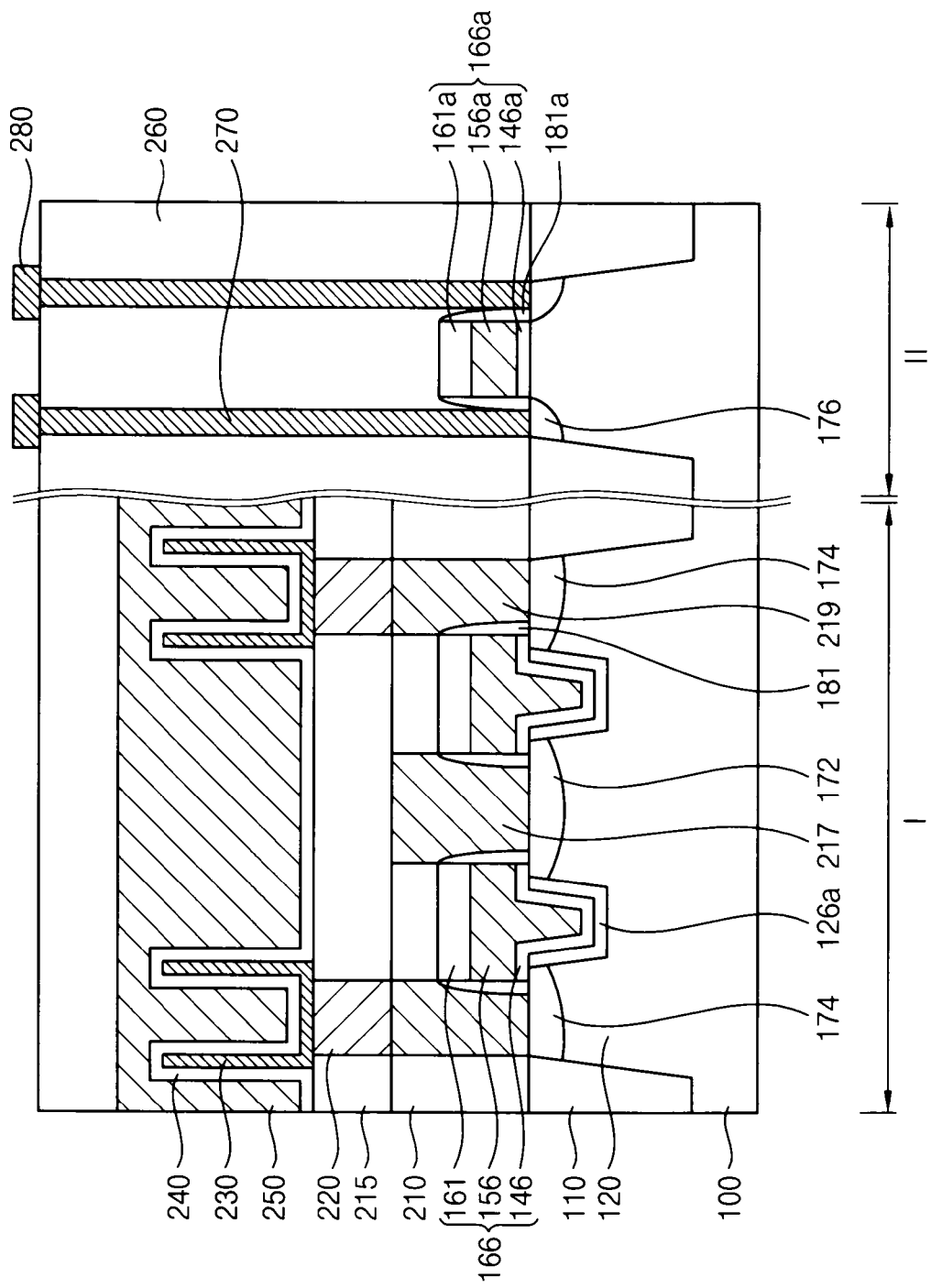

Referring to FIG. 54, a blocking layer (not shown) and a mold layer (not shown) may be formed on the second interlayer insulating film 215. Holes exposing upper surfaces of the third plugs 220 may be formed by removing a portion of the blocking layer and the mold layer.

A lower electrode layer may be formed along inner walls of the holes and upper surfaces of the mold layer. The lower electrodes may include doped polysilicon or metal and/or metal nitride such as titanium, titanium nitride, tantalum, tantalum nitride, tungsten nitride, ruthenium. After a sacrificing layer (not shown) is formed on the lower electrode layer, the portion of the sacrificing layer and the lower electrode layer may be removed. Lower electrodes 230 connected to the third plugs 220 may be formed by removing the sacrificing layer and the mold layer.

A dielectric layer 240 covering the lower electrodes 230 may be formed on the blocking layer and the second interlayer insulating layer 215. The dielectric layer 240 may include silicon nitride or high dielectric permittivity materials having higher dielectric constant than silicon nitride. Upper electrodes 250 may be formed on the dielectric layer 240. The upper electrodes may include metal and/or metal nitride such as titanium, titanium nitride, tantalum, tantalum nitride, tungsten nitride, ruthenium.

According to the exemplary embodiments, capacitors including the lower electrodes 230, the dielectric layer 240, the upper electrodes 250 may be formed.

An upper insulating layer 260 covering the capacitors and the second gate structures 166a may be formed on the substrate 100. Third holes (filled with plugs 270 in FIG. 54) penetrating the upper insulating layer 260 and exposing the third impurity regions 176 may be formed and a fourth conductive layer filling the third holes may be formed on the upper insulating layer 260. Fourth plugs 270 contacting with the third impurity regions may be formed by removing upper surfaces of the fourth conductive layer until an upper surface of the insulating layer 260 through CMP and/or etchback process is exposed. Interconnection structures 280 connected electrically to the fourth plugs 270 may be formed.

Semiconductor devices including transistors according to the exemplary embodiments may be acquired by performing processes explained above.

According to the exemplary embodiments, the same or similar processes to processes explained with respect to any of the embodiments disclosed herein may be performed on the first region (I) of the substrate 100. Therefore, transistors including the first recessed gate structures and having the extended channels may be formed according to any of the embodiments described herein. In alternative embodiments, the second gate structures 166a may also be formed with the same or similar processes explained with respect to any of the embodiments described herein.

According to the exemplary embodiments, semiconductor devices including recessed channel transistors may be acquired by performing the same or similar processes to processes explained in FIGS. 53 and 54.

Figure 55:
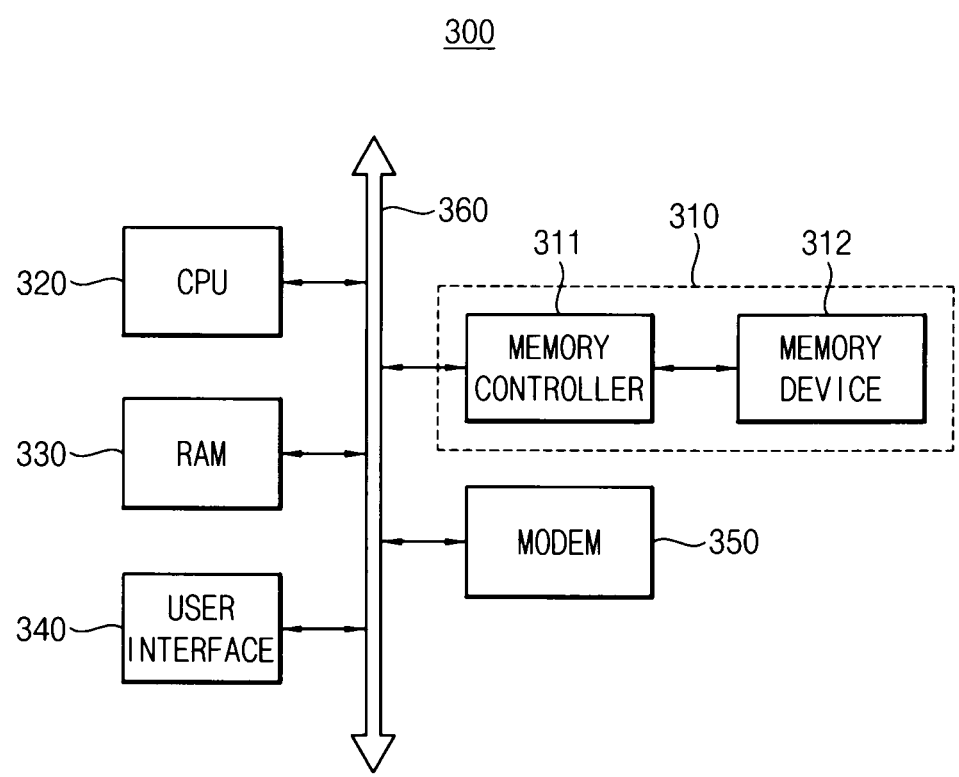

FIG. 55 is a schematic block diagram illustrating an example of computing systems including semiconductor device according to the exemplary embodiments.

Referring to FIG. 55, a computing system 300 may include a mobile device or a computer. For example, the information processing system 300 may include a modem 350, a central processing unit (CPU) 320, a RAM 330, and a user interface unit 340 that are electrically connected to a memory system 310 through a system bus 360. The memory system 310 may store data processed by the central processing unit or data inputted from an external device. The memory system 310 may include a memory device 312 and a memory controller 311. The memory device 312 may include recessed channel transistors according to any of the exemplary embodiments described herein. The memory system 310 may be substantially the same as a memory card and a solid state disk (SSD). The computing system 300 may be realized as a memory card, a solid state disk (SSD) device, a camera image sensor and another type of application chipset. For example, the memory system 310 may consist of the SSD device. In this case, the computing system 300 may stably and reliably store massive data. The above-disclosed subject matter is to be considered illustrative, and not restrictive. Many alternatives embodiments are intended to fall within the scope of the invention. For example, dome embodiments have focused on use of a recessed channel transistor with a memory device and/or memory cells of a memory device. However, other uses of the recessed channel transistors disclosed herein are of considered within the scope of this invention. The appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor memory device, comprising:
a first memory cell formed with a first fin shaped active region, the first memory cell including a first transistor comprising a first channel, two first source/drains and a first gate disposed at the first channel;
a second memory cell formed with a second fin shaped active region, the second memory cell including a second transistor comprising a second channel, two second source/drains and a second gate disposed at the second channel;
a third memory cell formed with a third fin shaped active region, the third memory cell including a third transistor comprising a third channel, two third source/drains and a third gate disposed at the third channel;
a gate line disposed over the first, second and third channels extending in a first direction, the first gate, the second gate and the third gate being portions of the gate line;
wherein, each of the first, second and third fin shaped active regions extend in a second direction, and each are formed of a semiconductor material and comprise:
a top surface, a first sidewall extending towards the top surface, a second sidewall opposite the first sidewall extending towards the top surface, a recess being formed in the top surface of the fin shaped active region extending through the fin shaped active region in the first direction, wherein the fin shaped active region has a larger thickness at a first location below the recess than a thickness of the fin shaped active region at a second location having the same height as the first location,
wherein the second transistor is located between the first transistor and the third transistor, and
wherein the first fin shaped active region and second fin shaped active region are spaced a first distance apart, and the second fin shaped active region and the third fin shaped active region are spaced a second distance apart, wherein the second distance is larger than the first distance.

2. The semiconductor memory device of claim 1, wherein a ratio of the second distance to the first distance is within a range of 2 to 10.

3. The semiconductor memory device of claim 1, wherein a ratio of the second distance to the first distance is within a range of 3 to 5.

4. The semiconductor memory device of claim 1,
wherein the memory device is a dynamic random access memory device, and
wherein each of the first, second and third transistors is connected to a respective capacitor at one of the two source/drains of the respective transistor.

5. The semiconductor memory device of claim 4, wherein the gate line is a word line.

6. The semiconductor memory device of claim 1, wherein the semiconductor material of each of the first, second and third fin shaped active regions is crystalline.

7. The semiconductor memory device of claim 1, wherein, for each of the first, second and third fin shaped active regions, a portion of the fin shaped active region at a first distance below the recess of the fin comprises polysilicon.

8. The semiconductor memory device of claim 1, wherein, for each of the first, second and third fin shaped active regions, a vertical cross section of the fin taken at a location including the recess is asymmetrical.

9. The semiconductor memory device of claim 1,
wherein, the second sidewall of the first fin shaped active region and the first sidewall of the second fin shaped active region face each other and are substantially flat, and
wherein, the first sidewall of the first fin shaped active region and the second sidewall of second fin shaped active region face away from each other and each comprise a substantially flat major surface and a protrusion from the substantially flat major surface at a respective location under the respective recess.

10. The semiconductor memory device of claim 9, wherein each protrusion of the first and second fin shaped active regions protrude from a respective substantially flat major surface in the first direction and have a length in the second direction at a first height is equal to a width of the gate line in the second direction at the first height.

11. The semiconductor memory device of claim 9, wherein, the substantially flat major surface of the first sidewall of the first fin shaped active region and the second sidewall of the second fin shaped active region are formed of a crystalline semiconductor material and the protrusions from the substantially flat major surface of the first sidewall of the first fin shaped active region and the second sidewall of the second fin shaped active region are formed of polysilicon.

12. The semiconductor memory device of claim 1, wherein each of the first, second and third fin shaped active regions comprise a protrusion from at least one of the first and second sidewalls of the respective first, second or third fin shaped active region at the corresponding recess and comprises a crystalline semiconductor material.

13. The semiconductor memory device of claim 1, wherein the first gate is disposed in the recess of the first fin shaped active region, the second gate is disposed in the recess of the second fin shaped active region and the third gate is disposed in the recess of the third fin shaped active region.

14. The semiconductor memory device of claim 13, wherein the first, second and third channels are each formed at a surface of corresponding recess of the respective first, second and third fin shaped active regions.

15. The semiconductor memory device of claim 14, wherein the first channel is formed at portions of the first and second sidewalls adjacent the recess of the first fin shaped active region, the second channel is formed at portions of the first and second sidewalls adjacent the recess of the second fin shaped active region and the third channel is formed at portions of the first and second sidewalls adjacent the recess of the third fin shaped active region.

16. The semiconductor memory device of claim 15, wherein, for each of the first, second and third fin shaped active regions, at least one of the first and second sidewalls of the respective fin shaped active region includes a protrusion from a substantially flat major surface at a location at an upper surface of the respective fin shaped active region defining the respective recess, and
wherein the first channel, second channel and third channel are formed at the respective protrusions of the first, second and third fin shaped active regions.

17. The semiconductor memory device of claim 14,
wherein the recesses of the fins of the first, second and third fin shaped active regions are each defined by a U-shaped surface of the respective fin shaped active region, and each of the first, second and third channels is formed at the respective U-shaped surface of the respective fin shaped active region.

18. The semiconductor memory device of claim 1, further comprising:
two first contacts each respectively contacting a respective one of the two first source/drains at a top surface of the fin shaped active region.

19. The semiconductor memory device of claim 18, wherein the first channel is formed at a surface of the first fin shaped active region defining a lowermost portion of the recess of the first fin shaped active region.

20. The semiconductor memory device of claim 1, further comprising:
a fourth transistor is formed with the first fin shaped active region.

21. The semiconductor memory device of claim 20,
wherein a dopant region of the first fin shaped active region forms one of the first source/drains of the first transistor and a source/drain of the fourth transistor.

* * * * *